United States Patent [19]
Tomita et al.

[11] Patent Number: 5,724,726
[45] Date of Patent: Mar. 10, 1998

[54] METHOD OF MAKING LEADFRAME FOR LEAD-ON-CHIP (LOC) SEMICONDUCTOR DEVICE

[75] Inventors: Yoshihiro Tomita; Naoto Ueda; Yoshirou Nishinaka; Shunichi Abe; Hideyuki Ichiyama, all of Itami, Japan

[73] Assignee: Mitsubishi Denki Kabushiki Kaisha, Tokyo, Japan

[21] Appl. No.: 614,552

[22] Filed: Mar. 13, 1996

Related U.S. Application Data

[62] Division of Ser. No. 325,637, Oct. 19, 1994, Pat. No. 5,535,509, which is a division of Ser. No. 70,990, Jun. 4, 1993, abandoned.

[30] Foreign Application Priority Data

Jun. 5, 1992 [JP] Japan .................. 4-145697

[51] Int. Cl.⁶ .................. H01R 43/00; H01L 21/60
[52] U.S. Cl. .................. 29/827; 29/856
[58] Field of Search .................. 29/827, 841, 856; 174/52.4, 52.2; 437/217, 220, 926, 211; 264/272.13, 272.15

[56] References Cited

U.S. PATENT DOCUMENTS

| | | | |
|---|---|---|---|
| 3,590,328 | 6/1971 | Frescura | 317/100 |
| 4,764,804 | 8/1988 | Sahara | 357/81 |
| 4,791,473 | 12/1988 | Phy | 357/70 |
| 4,820,658 | 4/1989 | Gilder, Jr. et al. | 437/209 |
| 4,897,508 | 1/1990 | Mahulikar et al. | 174/52.4 |
| 5,044,071 | 9/1991 | Toda et al. | 29/827 |
| 5,089,439 | 2/1992 | Lippey | 437/209 |
| 5,188,982 | 2/1993 | Huang | 437/209 |
| 5,218,229 | 6/1993 | Farnworth | 257/676 |
| 5,293,066 | 3/1994 | Tsumura | 257/668 |
| 5,339,518 | 8/1994 | Tran et al. | 29/827 |
| 5,535,509 | 7/1996 | Tomita et al. | 29/827 |

FOREIGN PATENT DOCUMENTS

| | | |
|---|---|---|
| 0108502 | 5/1984 | European Pat. Off. . |
| 0272187 | 6/1988 | European Pat. Off. . |
| 0354696 | 2/1990 | European Pat. Off. . |
| 54-21168 | 2/1979 | Japan . |
| 63-34966 | 2/1988 | Japan . |
| 63-306647 | 12/1988 | Japan . |
| 169041 | 3/1989 | Japan . |
| 180055 | 3/1989 | Japan . |
| 1187841 | 7/1989 | Japan . |
| 1289258 | 11/1989 | Japan . |
| 245969 | 2/1990 | Japan . |
| 2143449 | 6/1990 | Japan . |
| 2158159 | 6/1990 | Japan . |
| 2137253 | 8/1990 | Japan . |
| 2213156 | 8/1990 | Japan . |
| 33354 | 1/1991 | Japan . |
| 344956 | 2/1991 | Japan . |
| 3167834 | 7/1991 | Japan . |
| 3235360 | 10/1991 | Japan . |
| 412561 | 1/1992 | Japan . |
| 443670 | 2/1992 | Japan . |
| 449649 | 2/1992 | Japan . |

OTHER PUBLICATIONS

IBM Technical Disclosure Bulletin, vol. 15, No. 12, May 1973, pp. 3612–3613.

*Primary Examiner*—Peter Vo
*Attorney, Agent, or Firm*—Leydig, Voit & Mayer, Ltd.

[57] ABSTRACT

A method of making a semiconductor device having a lead-on-chip structure includes bending a die pad extending from an outer frame outwardly from the outer frame. Thereafter, with the die pad in a convenient position, a semiconductor chip is die-bonded to the die pad. Thereafter, the die pad is bent back toward the outer frame so that it is generally parallel to but spaced from the outer frame with leads extending from the outer frame being generally parallel to the semiconductor chip. Electrodes of the semiconductor chip are connected by wire-bonding to the leads extending from the outer frame. After resin molding, the outer frame lying outside the resin package is severed and removed, completing the lead-on-chip semiconductor device.

4 Claims, 25 Drawing Sheets

FIG. IA
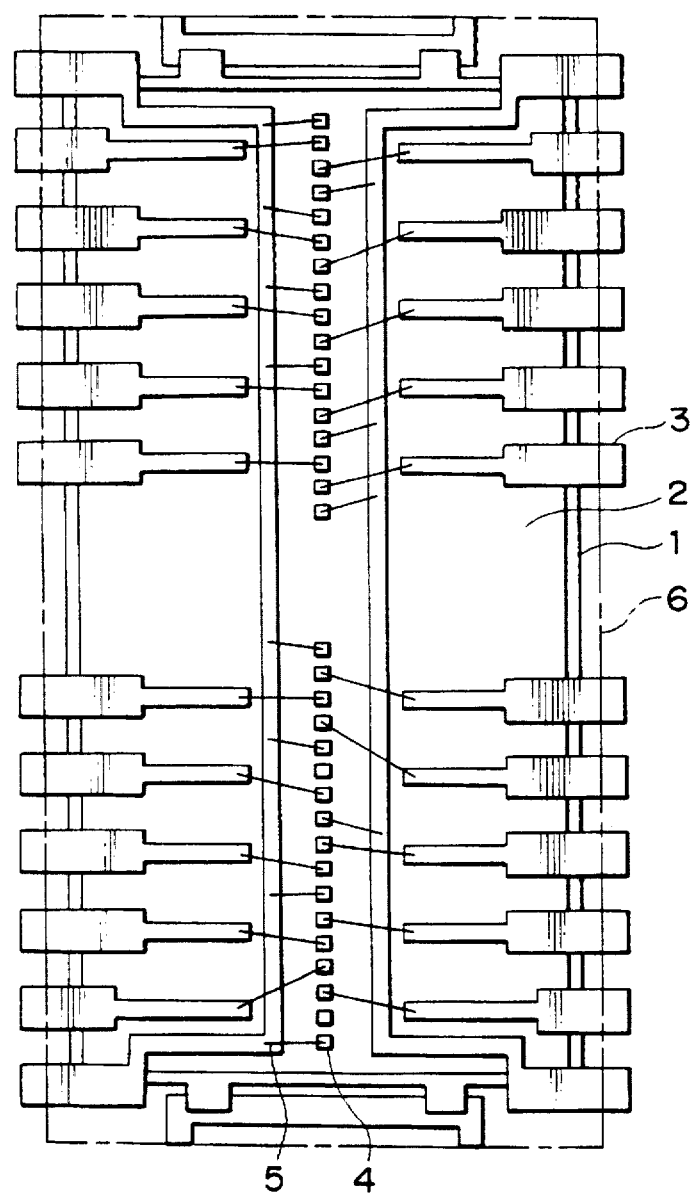
FIG. IB
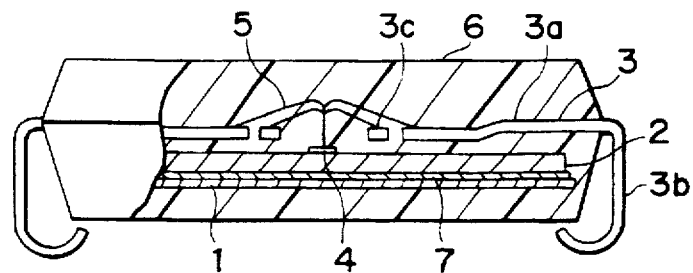

METHOD OF MAKING LEADFRAME FOR LEAD-ON-CHIP (LOC) SEMICONDUCTOR DEVICE

This disclosure is a division of patent application Ser. No. 08/325,637, filed Oct. 19, 1994 now U.S. Pat. No. 5,535,509, which is a division of patent application Ser. No. 08/070,990, filed Jun. 4, 1993, now abandoned.

FIELD OF THE INVENTION

The present invention relates to a semiconductor device having a lead-on-chip (LOC) structure with leads extending over a surface of a semiconductor chip and relates to a method for producing the structure. The present invention also relates to a leadframe for use in such a device or in production of such a device.

DESCRIPTION OF THE RELATED ART

FIG. 35 is a cross-sectional view of a conventional semiconductor device having a lead-on-chip structure (hereafter referred to as an LOC-structure). Such a device is disclosed, for example, in Japanese Published Patent Application 2-45969. As shown in FIG. 35, the device comprises a die pad 1, a semiconductor chip 2, and a plurality of leads 3 extending toward the semiconductor chip from both sides, each of the plurality of leads 3 comprising an inner lead portion 3a and an outer lead portion 3b. The device comprises wires 5, molding resin 6, and a plurality of electrodes 4 along both sides of a primary surface of the semiconductor chip 2.

An integrated circuit (not shown) and electrodes 4 are formed by photolithography or the like on the upper primary surface of the semiconductor chip 2. The semiconductor chip 2 is fixed on the die pad 1 by bonding the primary rear surface of the semiconductor chip 2 to the die pad 1 with a conductive adhesive, such as a conductive resin. The inner lead portions 3a are each electrically connected to the electrodes 4 on the semiconductor chip 2 via the wires 5. These elements described above are sealed within molding resin 6 except for the outer lead portions 3b so that each outer lead portion 3b is exposed. The outer lead portions 3b of the leads 3 are each formed into a desired shape, such as a straight line, a gull wing, a J, etc.

Japanese Published Patent Application 2-45969 also discloses a method for producing the device described above. In accordance with this method, two frames are used: a first frame comprising an outer frame and a die pad disposed inside the outer frame, the die pad being connected to the outer frame via a suspending lead, and a second frame comprising an outer frame and a plurality of leads extending inward from the outer frame. The die pad of the first frame is sunk (depressed) downward by a distance larger than the thickness of the semiconductor chip. After a semiconductor chip is die-bonded to the die pad of the first frame, the second frame is connected to the first frame so that each lead extends over the semiconductor chip with a predetermined constant spacing between each lead and the upper surface of the chip. Then, wire-bonding and resin-molding are performed. The unnecessary portions of the frames, such as outer frames, are removed to obtain a semiconductor device. Finally, each outer lead portion of the leads is bent and a completed semiconductor device is obtained.

In a conventional semiconductor device with the LOC-structure described above, a semiconductor chip is die-bonded to a die pad with a conductive resin or the like. However, resin materials absorb moisture. Moisture absorbed in resin may degrade adhesive strength and/or may corrode the semiconductor chip or leads in contact with the resin. To mount a semiconductor device on a circuit board or the like, the semiconductor device is put on the circuit board and then the circuit board with the chip is placed in a hot environment. Thus, the outer lead portions are soldered to the circuit board. The moisture absorbed in the die-bonding resin confined in the molding resin evaporates during the soldering process, which may result in separation of the semiconductor chip from the die pad and/or in cracks in the package.

In the conventional production method using two frames, the outer parts of two frames remain connected to each other until the molding process is completed. As a result, these outer frames act as obstacles, and difficulty occurs in handling. Therefore, during the succeeding processes after the two frames are connected, failures often occur in transferring frames and/or liquid used for processing penetrates between the outer frames, leaking later to cause contamination. In particular, in the case of a production process including plating the outer lead portions of the semiconductor device before separating the semiconductor device from the frames, serious problems occur because plating solution can penetrate between two outer frames and leak at some later time.

In another method known in the art, a single frame is used to produce a semiconductor device having an LOC-structure, the single frame comprising a die pad and integral leads. In such a leadframe, a die pad is disposed between the leads extending from both sides of the leadframe, and the die pad extends in directions perpendicular to these leads. However, the width of the die pad cannot be enlarged to exceed the lead area. As a result, only narrow die pads are available. Japanese Published Patent Application 64-69041 discloses a leadframe having a die pad with a large width extending beyond the area of the leads. In this case, however, the length of leads, in turn, might be shortened; otherwise, the leads may be deformed. As a result, longer wires are required for wire-bonding and/or the choice of locations of the electrodes on the semiconductor chip is limited.

When a semiconductor device is produced using a leadframe having a die pad and integral leads, the die pad is sunk by the distance corresponding to the thickness of a semiconductor chip, the semiconductor chip is inserted between the leads and the die pad, and then the semiconductor chip is die-bonded on the die pad. However, when the die pad extends perpendicular to the direction in which the leadframe is transferred during production processes, the semiconductor chip must be inserted between the leads and the sunk die pad in the same direction as that of the leadframe transfer path. This insertion process is difficult to perform, and complicated and troublesome operations are required. Furthermore, it also requires complicated and troublesome operations to die-bond a semiconductor chip to the die pad with hard solder after the semiconductor chip is inserted. These problems exist in conventional semiconductor devices and methods for producing them.

SUMMARY OF THE INVENTION

It is an object of the present invention to solve the problems described above. More specifically, it is an object of the present invention to provide a higher reliability semiconductor device having an LOC-structure in which no corrosion occurs. It is another object of the present invention to provide a method for producing such a semiconductor device without liquid-leakage during production processes. It is a further object of the present invention to provide a leadframe for use in such a semiconductor device.

To achieve the above objects, in accordance with a first aspect of the present invention, a semiconductor device having an LOC-structure is provided wherein a semiconductor chip is die-bonded to a die pad with a hard solder that does not absorb moisture.

In accordance with a second aspect of the present invention, a method is provided for producing such a semiconductor device using two frames, a frame for the leads and a frame for the die pad, wherein, immediately after these two frames are connected to each other, an outer frame portion of the frame for the die pad is cut off and removed via frame-cutting slits in the frame for leads.

A third aspect of the present invention provides a leadframe comprising two frames including a frame for leads, having frame-cutting slits, for use in production of a semiconductor device in accordance with the second aspect of the invention.

Furthermore, a fourth aspect of the present invention provides a leadframe for use in production of a semiconductor device comprising a unitary die pad and leads, the die pad including a main pad disposed between two sets of leads, one of the sets of leads being formed on one side of an outer frame of the leadframe and the other set of leads being formed on the other side of the outer frame of the leadframe, the main pad extending perpendicular to these leads, the leads extending inward from both sides of the outer frame of the leadframe, the die pad further including at least one branch pad extending approximately perpendicular to the main pad and extending between two neighboring leads from the above outer frame.

A fifth aspect of the present invention provides a method for producing a semiconductor device using a leadframe in accordance with the fourth aspect of the present invention. In this method, the width of a die pad is widened to ensure that a semiconductor chip can be located on the die pad in a more stable manner. Another feature of this method is that when a semiconductor chip is heated via a die pad to make wire-bonding easier, the efficiency of heat conduction is improved.

A sixth aspect of the present invention provides a leadframe including a die pad extending inward from an outer frame of the leadframe, the leadframe further including leads extending toward the die pad from both sides of the outer frame of the leadframe, the die pad and the leads being unitary. In this leadframe, the die pad is connected to the portions of the outer frame on both sides, wherein both the portions are bent in the same direction perpendicular to the leadframe plane to form U-shaped portions, so that the die pad is sunk from the outer frame and also from the leads. The U-shaped portions have a size large enough to insert a semiconductor chip through one of these U-shaped portions.

A seventh aspect of the present invention provides a method for producing a semiconductor device using a leadframe in accordance with the sixth aspect of the present invention, the leadframe including a die pad extending in a direction perpendicular to the leadframe-transfer direction, the leadframe further including leads extending toward the die pad from both sides of the outer frame of the leadframe, the die pad and the leads being unitary. In this method, portions of both sides of the outer frame at which the die pad is connected to the outer frame are bent in the same direction, perpendicular to the frame plane, to form U-shaped portions having a size large enough to insert a semiconductor chip through one of these U-shaped portions. Then, a semiconductor chip is inserted through one of the U-shaped portions at both sides of the outer frame, the U-shaped portions being located at the sides of the leadframe-transfer path.

An eighth aspect of the present invention provides a leadframe including a unitary die pad and leads within an outer frame, wherein only one end portion of the die pad is connected to the outer frame so that the die pad can be bent outward from the outer frame and so that a semiconductor chip can be die-bonded onto the die pad bent outward.

A ninth aspect of the present invention provides a method for producing a semiconductor device using a leadframe in accordance with the eighth aspect of the present invention. In this method, after bending a die pad outward from an outer frame, a semiconductor chip is die-bonded to the outwardly bent die pad. Then, the die pad with the semiconductor chip on it is bent back to the position at which the leads extending over the semiconductor chip have a predetermined constant spacing between the leads and the primary surface of the semiconductor chip.

A tenth aspect of the present invention provides a leadframe including a unitary die pad and leads so that the die pad is located in a first region of the frame and the leads are formed in a second region of the frame adjacent to the first region of the frame. The die pad is connected to the frame via suspending leads. One of these suspending leads is cut, and the other suspending lead is bent so that the die pad is placed above the leads.

An eleventh aspect of the present invention provides a method for producing a semiconductor device using a leadframe in accordance with the tenth aspect of the present invention. In this method, after die-bonding a semiconductor chip to a die pad, unnecessary portions of a frame around the die pad are cut off, and a suspending lead extending toward the lead area is bent into a U-shape so that the die pad with the semiconductor chip is placed above the lead area with a predetermined constant spacing between the die pad and the extending leads.

A twelfth aspect of the present invention provides a leadframe modified from a leadframe of the tenth aspect of the present invention in such a way that the suspending lead to be cut is made longer. This suspending lead is cut in such a way that the suspending lead remains connected to the die pad. After the die pad is folded over the leads, the long suspending lead remaining connected to the die pad is bent toward the leads to make a connection between the end portion of this remaining suspending lead and the frame of the lead area. Thus, a firmer connection of the die pad can be achieved.

A thirteenth aspect of the present invention provides a method for producing a semiconductor device using a leadframe in accordance with the twelfth aspect of the present invention. In accordance with this method, as described above, a die pad can be fixed more firmly to a frame of a lead area.

A fourteenth aspect of the present invention provides a die-bonding method comprising placing and pressing a metal foil onto a die pad; putting a semiconductor chip on the metal foil; heating the die pad from the surroundings to melt the metal foil; and stopping heating to solidify the melted metal foil so that the semiconductor chip is fixed to the die pad.

In the first aspect of the present invention, hard solder having no moisture absorption is used as a die-bonding material for die-bonding a semiconductor chip. As a result, corrosion of the semiconductor chip and cracks in a package are avoided.

In the method for producing a semiconductor device in accordance with the second aspect of the present invention and in the leadframe for use in the production of the semiconductor device in accordance with the third aspect of the present invention, after two frames are connected to each other, unnecessary portions of the frame for the die pad are cut off and removed via frame-cutting slits. As a result, during succeeding processes, the leadframe can be treated as if it comprises only one frame. As a result, production processes can be simplified and can be performed easily. In particular, leakage of plating solution can be effectively avoided.

In the leadframe and the method for producing a semiconductor device using this leadframe, in accordance with the fourth and fifth aspects of the present invention, respectively, the leadframe comprises a unitary die pad and leads, the die pad including a main pad and branch pads extending approximately perpendicular to the main pad, wherein the width and the area of the die pad are made larger. Each of the branch pads extends between two adjacent leads among a plurality of the leads extending inward from an outer frames. Thus, the existence of the branch pads causes no limitation in length and shape of the leads. Furthermore, because the width and the area of the die pad are enlarged, a semiconductor chip can be located on the die pad in a more stable manner. Moreover, improvement of the efficiency of heat conduction between the die pad and the semiconductor chip can be achieved and wire-bonding can be performed more easily.

In the sixth and seventh aspects of the present invention, regarding a leadframe and a method for producing a semiconductor device using this leadframe, respectively, a leadframe that includes a die pad extending in the direction perpendicular to the direction in which the leadframe is transferred during the processes for producing a semiconductor device is used. A semiconductor chip can be inserted between the die pad and the leads passing through one of U-shaped portions located on both sides of the outer frame, the U-shaped portions being located on the sides of leadframe-transfer path. Thus, the chip-insertion process is simplified and can be performed easily. In addition, in a leadframe in accordance with the sixth aspect of the present invention, independently of the direction in which the die pad extends, the die pad can be sunk from the leads by bending the portions of both sides of the outer frame at which the die pad is connected to the outer frame into a U-shape. This makes the leads extending from one side closer to the leads extending from the other side. Thus, it is possible to make the leads reach locations closer to the central part of the semiconductor chip.

In the eighth and ninth aspects of the present invention, regarding a leadframe and a method for producing a semiconductor device using this leadframe wherein the leadframe includes a unitary die pad and leads, the die pad can be bent outward from the outer frame. In this situation in which the die pad is bent outward, a semiconductor chip can be die-bonded to this die pad. This allows a simpler and easier die-bonding process compared to the case where a semiconductor chip is inserted between a die pad and leads.

In the tenth and eleventh aspects of the present invention, regarding a leadframe and a method for producing a semiconductor device using this leadframe wherein the leadframe includes a unitary die pad and leads, a semiconductor chip can be easily die-bonded to the die pad without any special process.

In the twelfth and thirteenth aspects of the present invention, regarding a leadframe and a method for producing a semiconductor device using this leadframe, the die pad can be connected to a frame for leads more firmly by modifying the leadframe and method in accordance with the tenth and eleventh aspects of the invention so that a suspending lead remaining connected to the die pad is bent and is further connected to the frame for leads. Thus, the succeeding processes can be performed more easily and more accurately.

In the die-bonding method in accordance with the fourteenth aspect of the present invention, a metal foil, such as solder, disposed between a die pad and a semiconductor chip is heated from the surroundings to melt the metal foil. Thus, this method provides an easier die-bonding process and a significant advantage, particularly when die-bonding is performed after a semiconductor chip is inserted between the die pad and inner lead portions.

BRIEF DESCRIPTION OF THE DRAWINGS

FIG. 1A is a plan view of an embodiment of a semiconductor device in accordance with a first aspect of the present invention;

FIG. 1B is a side view, partially cross-sectioned, of the semiconductor device of FIG. 1A;

DESCRIPTION OF THE PREFERRED EMBODIMENTS

The First Aspect of the Invention

Figure 2:
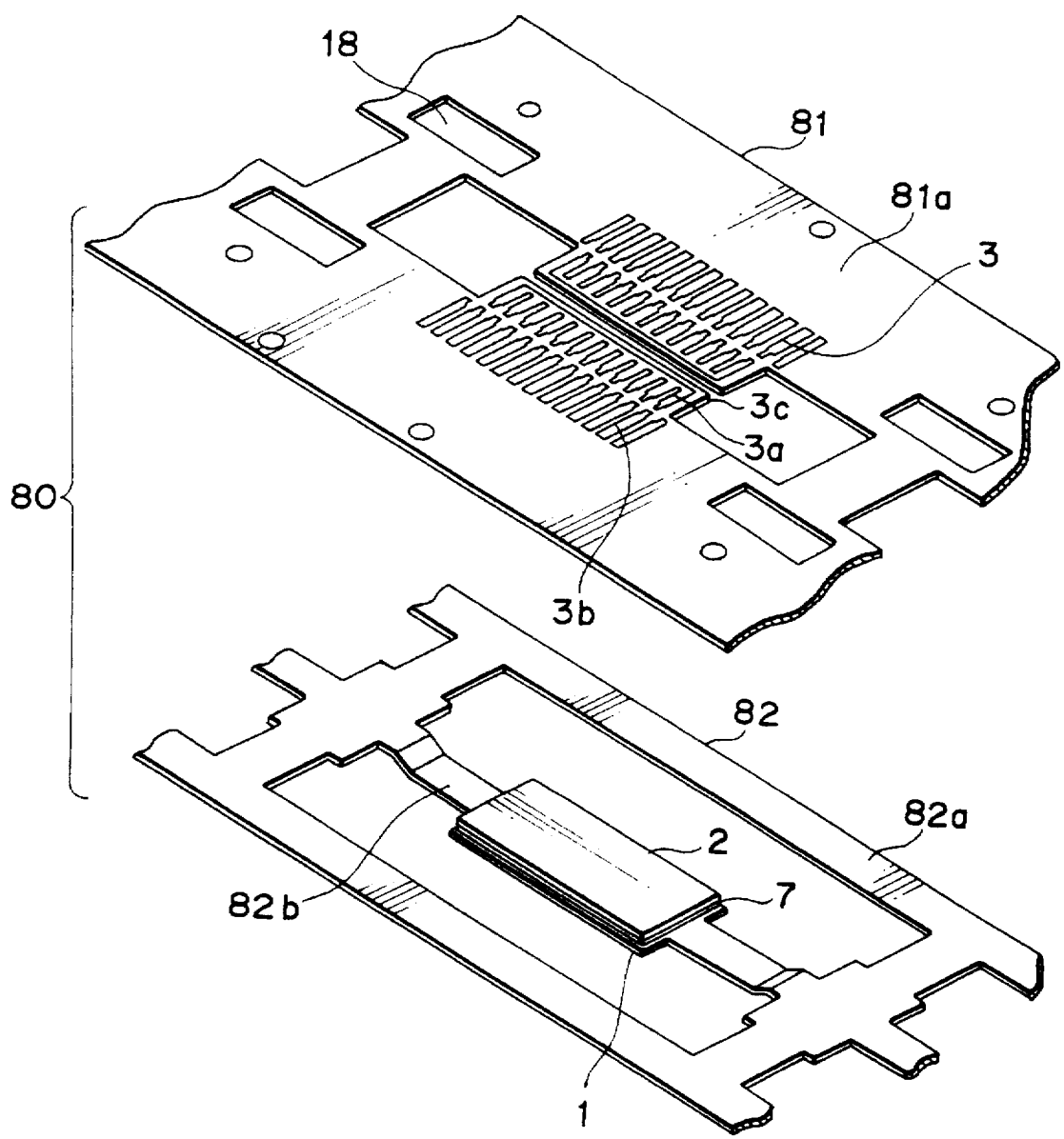
FIG. 2 is a perspective view showing the structure of a leadframe relating to second and third aspects of the present invention.

FIGS. 1A and 1B show an embodiment of a semiconductor device having an LOC-structure in accordance with the first aspect of the present invention. FIG. 1A is a plan view showing inner structure and FIG. 1B is a side view, partially cross-sectioned, of the device. As shown in these figures, the device comprises a die pad 1, a semiconductor chip 2, leads 3 having an inner lead portion 3a and an outer lead portion 3b, electrodes 4, wires 5, and molding resin 6 forming a package. This device has substantially the same structure as that of conventional semiconductor devices except that the electrodes 4 are located along a straight line in a central part of the semiconductor chip.

There are also provided common leads 3c primarily used for supplying electrical power or a ground connection wherein the common leads 3c extend over the central portion of the semiconductor chip 2 in the longitudinal direction. In addition, hard solder 7, such as conventional solder, is provided for die-bonding the semiconductor chip 2 to the die pad 1. The hard solder 7 has no moisture absorption so there is no possibility that moisture will corrode the semiconductor chip 2. Furthermore, there is no possibility that moisture will cause cracks in a package, even if the whole device is heated when a completed semiconductor device is attached to a circuit board (not shown) by soldering the outer lead portions 3b. Because the hard solder material 7 for connecting the semiconductor chip 2 to the die pad is disposed in an inner portion covered with molding resin 6, less heat is provided to this hard solder material 7 than to the external portions. Thus, the hard solder material 7 does not melt during the soldering process. If necessary, the hard solder material 7 may be selected so that it has a melting point high enough not to be melted during the soldering process for mounting the semiconductor device on a circuit board. In the case of conventional solder, this result can be achieved by selecting the ratio between tin and lead.

The Second and Third Aspects of the Invention

FIG. 2 shows a leadframe comprising two frames in accordance with the second and third aspects of the present invention. The second aspect of the present invention relates to a method for producing a semiconductor chip using a leadframe, and the third aspect relates to the leadframe itself. As shown in FIG. 2, a leadframe 80 comprises a frame 81 for leads and a frame 82 for a die pad for use in the present invention. These frames 81 and 82 are each produced from a single metal sheet by punching or etching. The frame 81 for leads comprises common leads 3c and a plurality of leads 3 extending inward from both sides of the outer frame 81a. Each of the leads 3 comprises an inner lead portion 3a and an outer lead portion 3b. The frame 81 for leads has frame-cutting slits 18 located in the outer frame part 81a. The frame 82 for a die pad includes a die pad 1, both sides of the die pad 1 being connected to inner portions of an outer frame 82a via suspending leads 82b. The die pad 1 has a shape similar to the shape of a semiconductor chip 2 to be die-bonded so that the semiconductor chip 2 can be fixed onto the die pad in a stable manner. The semiconductor chip 2 is die-bonded to the die pad 1 via a hard solder material 7, as shown in FIG. 2. In the frame 82 for a die pad, the suspending leads on both sides are bent by an amount determined by taking the thickness of the semiconductor chip 2 into account, so that the die pad 1 is sunk from the surrounding outer frame 82a. Thus, when the frames 81 and 82 are connected to each other, the common leads 3c and the inner lead portion 3a of each lead 3 extend over and parallel to the primary surface of the semiconductor chip 2 with a predetermined constant spacing between the leads and the surface of the semiconductor chip 2.

In known technologies, a die pad is integral with and between common leads 3c or between inner lead portions 3a extending from both sides of an outer frame part 81a of the frame 81 for leads. However, in such a frame, the width of the die pad 1 cannot be widened beyond the region of the leads. In contrast, in this specific aspect of the present invention, wherein two frames, that is, a frame 81 for leads and a frame 82 for a die pad, are connected to each other, the shape of die pad 1 can be designed independently of the shape of leads. Thus, the die pad 1 can be widened as required. A semiconductor chip 2 may also be die-bonded in a different way such that, after the two frames 81 and 82 are connected to each other, the semiconductor chip 2 is between the die pad 1 and the inner lead portions 3a and fixed to the die pad 1.

Figure 3A:
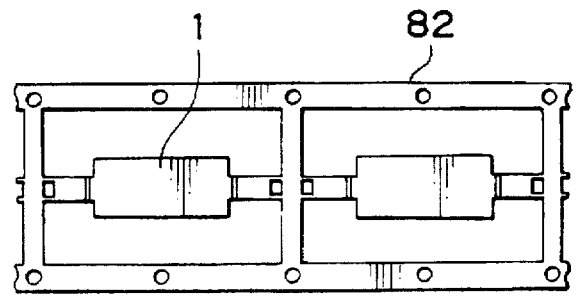
FIGS. 3A-3C are plan views of a semiconductor device for explanation of successive production steps in accordance with a second aspect of the present invention.
Figure 3B:
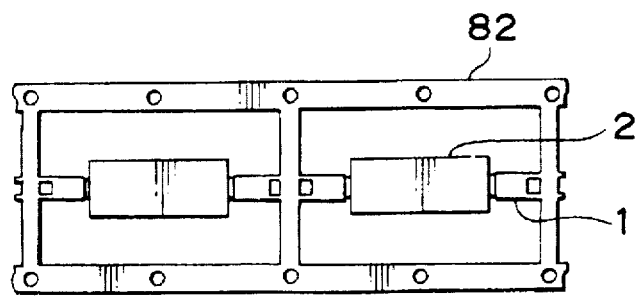
Figure 3C:
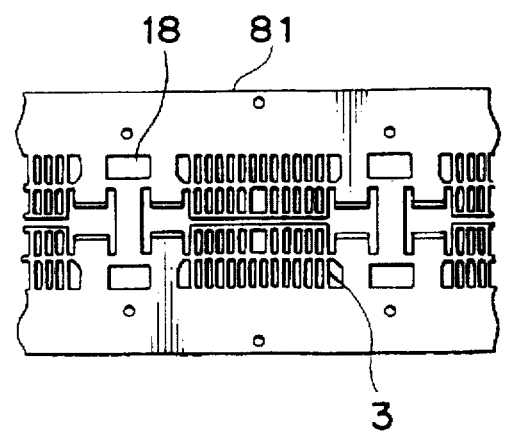
Figure 4A:
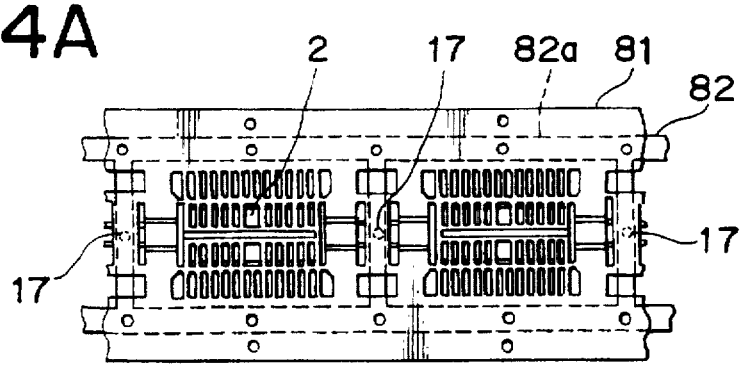
FIGS. 4A-4D are plan views of a semiconductor device for explanation of further production steps following the step shown in FIG. 3C.
Figure 4B:
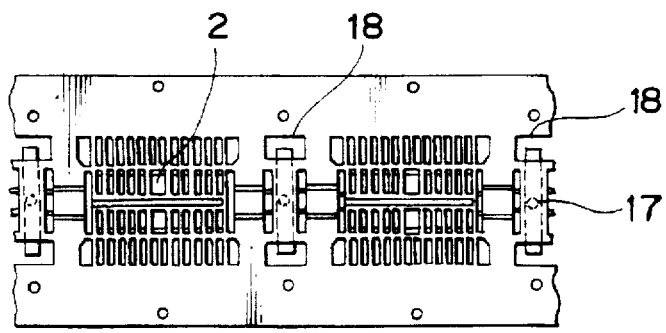
Figure 4C:
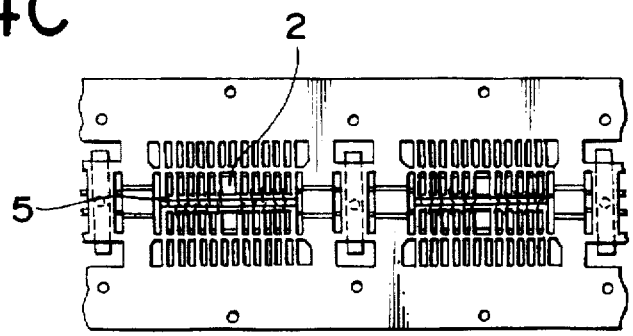

A method for producing a semiconductor device in accordance with the second aspect of the present invention is illustrated in FIGS. 3A–3C and FIGS. 4A–4D. A flowchart of this production method is also shown in FIG. 5. First, a semiconductor chip 2 is fixed to a die pad 1 of a frame 82 for a die pad shown in FIG. 3A using a hard solder material 7, such as a conventional solder, having no moisture absorption (see FIGS. 1 and 2). Now, the situation becomes as shown in FIG. 3B (die-bonding step S1). Then, a frame 81 for leads having frame-cutting slits 18, as shown in FIG. 3C, is put on the frame 82 for a die pad, the situation shown in FIG. 3B, and the frames are connected to each other, as shown in FIG. 4A, by a method (for example, spot welding) that will be described later (connecting step S2).

Then, an unnecessary outer frame part 82a of the frame 82 for a die pad is cut off, for example, by die-cutting. Thus, the die pad 1 with the semiconductor chip 2 remains connected to connecting portions 17 on both sides (outer-frame cutting-off step S3). After that, the resultant combined frames can be treated as a leadframe, and the successive production processes can be performed easily. Moreover, this results in elimination of the possibility of accumulation or leakage of plating solution used in a later process of exterior-plating. Then, electrodes 4 (see FIG. 1) along the center line of the semiconductor chip 2 are electrically connected via the wires 5 to the inner lead portions 3a and/or the common leads 3c extending over the chip 2 (wire-bonding step S4).

Figure 4D:
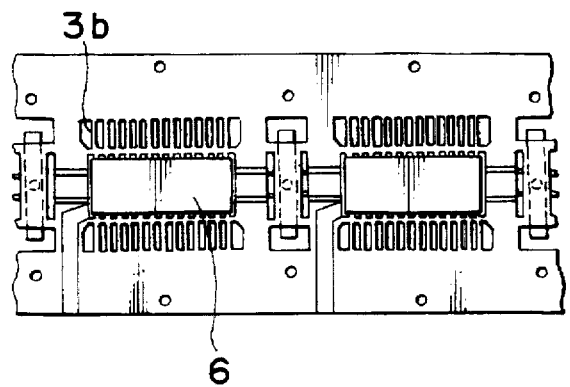
Figure 5:
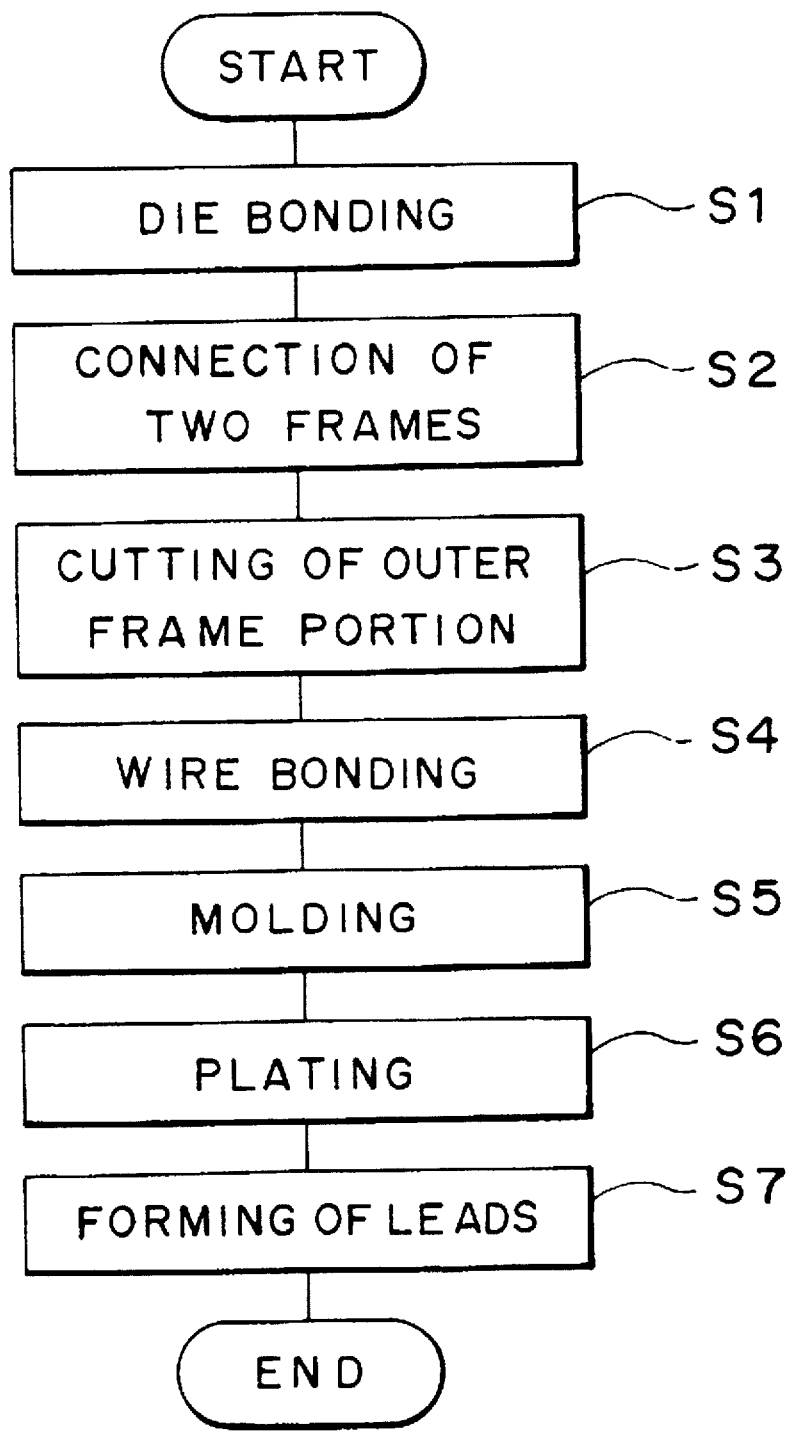
FIG. 5 is a flowchart showing a method for producing a semiconductor device according to FIGS. 3A-3C and FIGS. 4A-4D.

After wire-bonding is performed, the frame is put into a mold (not shown) and resin is injected into the mold to seal the main pad including the semiconductor chip 2 with molding resin 6, as shown in FIG. 4D (molding step S5). In this step, the outer lead portions 3b are not covered with the resin but are exposed. The following steps are not shown in the figures, but the outer lead portions 3b are plated (plating step S6) and the semiconductor device including the outer lead portions 3b are cut off from the frame and tie-bars are also cut off to separate the outer lead portions 3b into individual leads. Furthermore, the separated outer lead portions 3b are formed into a desired shape in lead forming step S7 so that a completed semiconductor device is obtained.

The frame-cutting slits 18 may be present in either of two frames. The shape of the slits is not limited to that shown in the figures. Instead of die-cutting, laser cutting, or the like may be used for the same purpose, i.e., for cutting off the outer-frame portion of the frame 82 for die pad. In this specific example, the semiconductor chip 2 is die-bonded with a hard solder material 7. However, other materials may be used not only in this first aspect but also in any of the other aspects of the present invention.

Figure 6:
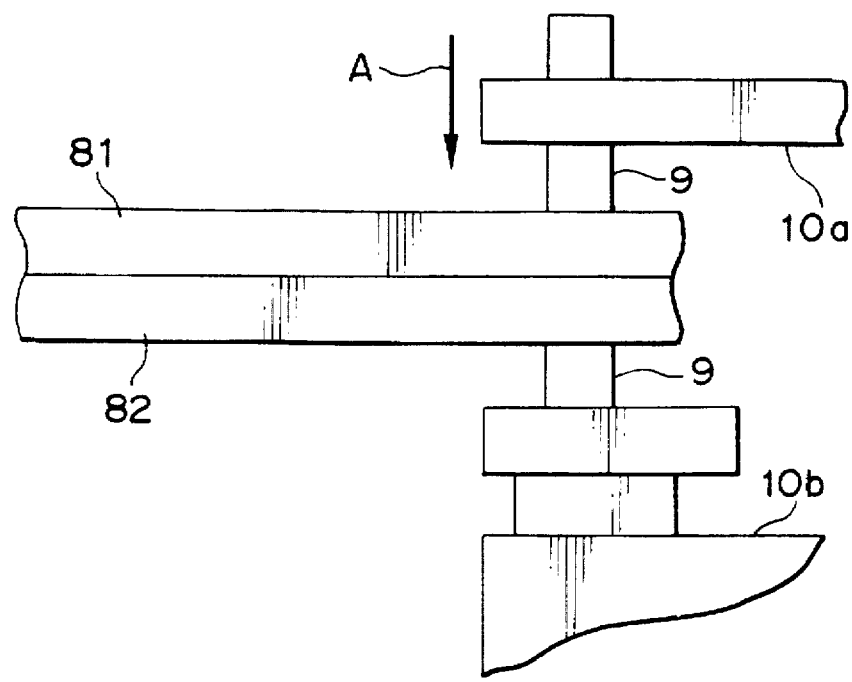
FIG. 6 is a side view for explanation of a first embodiment of a method for connecting two frames in accordance with the second aspect of the present invention.

Now, in accordance with the second aspect of the present invention, there will be described some examples of the methods for connecting a frame 81 for leads to a frame 82 for a die pad. FIG. 6 shows a first embodiment of a method for connecting a frame 81 for leads to a frame 82 for a die pad. In this embodiment, connection is made by resistance welding, a spot-welding technique. In this figure, there are shown welding electrodes 9, an electrode-holding bar 10a for holding the upper welding electrode 9, and an electrode-holding base 10b for holding the lower welding electrode 9. A frame 81 for leads and a frame 82 for a die pad are put between the upper and lower welding electrodes and pressed by them by moving the electrode-holding bar 10a in the direction denoted by the arrow A in FIG. 6. By supplying a current between the upper and lower welding electrodes 9, the frames 81 and 82 are spot-welded. Resistance welding has the advantages that a larger bonding strength can be obtained and that only little deformation occurs at the surface of a welded portion. Another great advantage of resistance welding is that welding dust is not generated. Thus, little contamination of the semiconductor chip 2 occurs. Spot welding can be also performed by laser welding.

Figure 7:
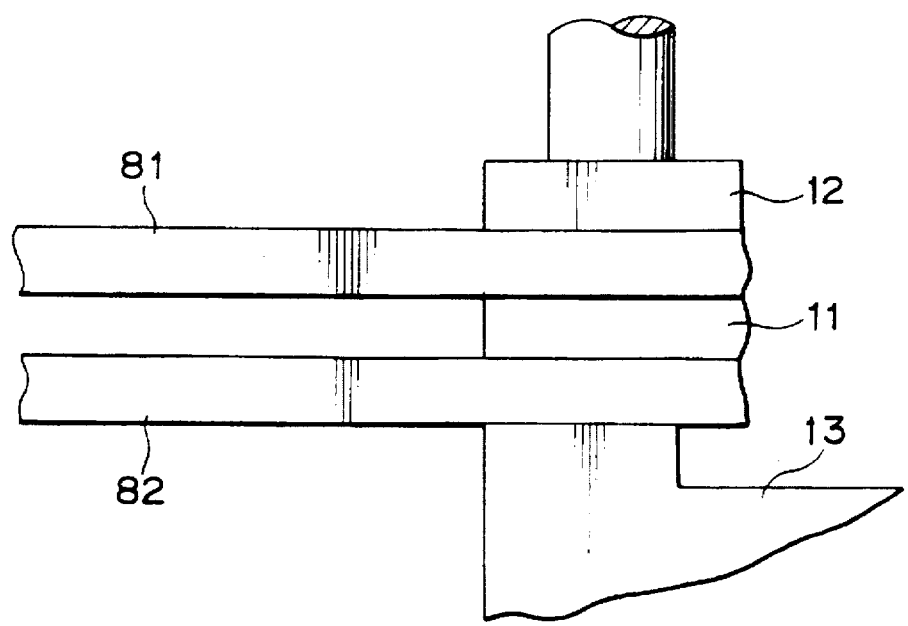
FIG. 7 is a side view for explanation of a second embodiment of a method for connecting two frames in accordance with the second aspect of the present invention.

FIG. 7 shows a second embodiment of a method for connecting a frame 81 for leads to a frame 82 for a die pad. In this embodiment, connection is made by an adhesive tape. In this figure, there are shown an adhesive tape 11, a pressing fixture 12, and a frame-holding base 13. The adhesive tape 11 is placed between frame 81 for leads and a frame 82 for a die pad, and these frames 81 and 82 with the adhesive tape 11 are put on the frame-holding base 13 and are pressed by the pressing fixture 12 so that both frames 81 and 82 are connected to each other via the adhesive tape 11. This method has an advantage over laser welding in higher throughput and an advantage over spot welding in that there is no need for maintenance of equipment.

Figure 8:
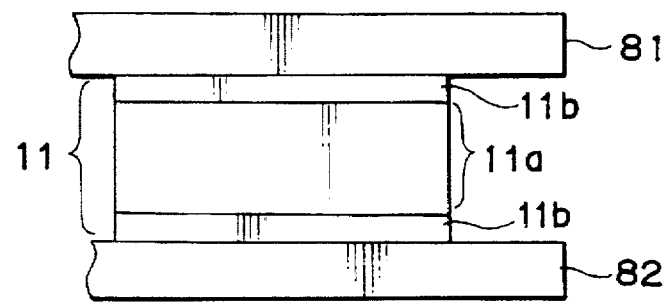
FIG. 8 is a side view for explanation of a third embodiment of a method for connecting two frames in accordance with the second aspect of the present invention.

FIG. 8 shows a third embodiment of a method for connecting a frame 81 for leads to a frame 82 for a die pad. In this embodiment, connection is made using an adhesive tape in a similar way to FIG. 7. However, in this case, the adhesive tape 11 comprises an adhesive tape base 11a and thermoplastic adhesives 11b on both of its surfaces. In this embodiment, each surface of the adhesive tape 11 is bonded to the frame 81 or the frame 82 via a thermoplastic adhesive 11b. As a result, even if processing steps, such as wire-bonding and molding (sealing), produce thermal stresses, the thermoplastic adhesive 11b absorbs the stress caused by the difference in thermal expansion of frames 81 and 82. Thus, the total thermal deformation of the frames can be minimized. Although an adhesive tape is used in the connecting methods shown in FIGS. 7 and 8, the connection is made outside of the area to be molded with molding resin 6. Thus, even if the adhesive tape absorbs moisture, no problems from moisture expansion will occur.

Figure 9A:
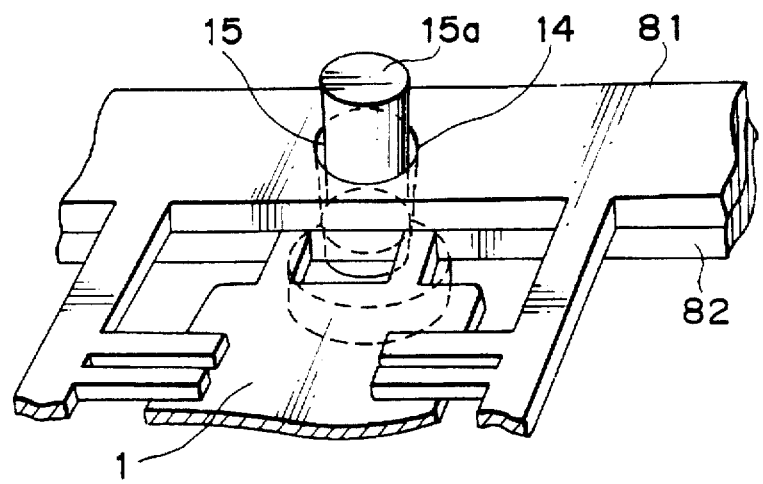
FIGS. 9A and 9B are perspective views for explanation of a fourth embodiment of a method for connecting two frames in accordance with the second aspect of the present invention.
Figure 9B:
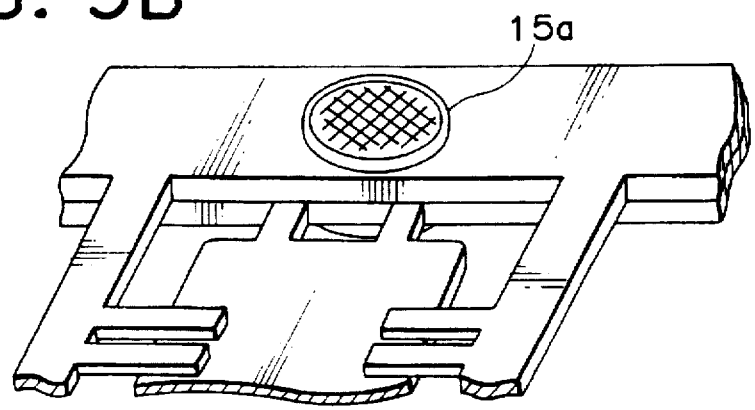

FIGS. 9A and 9B show a fourth embodiment of a method for connecting a frame 81 for leads to a frame 82 for a die pad. In this embodiment, the connection is made using a rivet. There are holes 14 in each of the frames 81 and 82 and a rivet 15. As shown in FIG. 9A, two frames 81 and 82 are put on top of each other, and then a rivet 15 is inserted through holes 14. Then, the upper end of the rivet 15 is pressed and spread out to fasten the two frames 81 and 82 together. The shapes of the rivet 15 and holes 14 are not limited to those shown in the figures. Instead of the rivet 15, any other element having a similar function may be used.

Figure 10A:
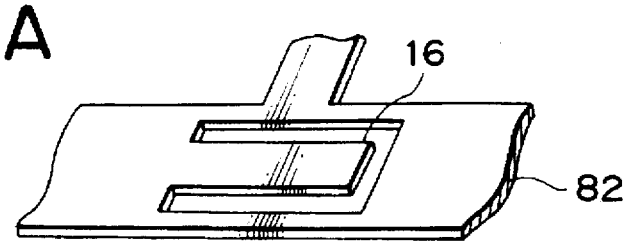
FIGS. 10A-10D are perspective views for explanation of a fifth embodiment of a method for connecting two frames in accordance with the second aspect of the present invention.
Figure 10B:
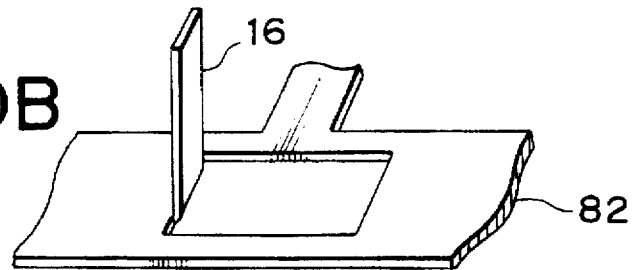
Figure 10C:
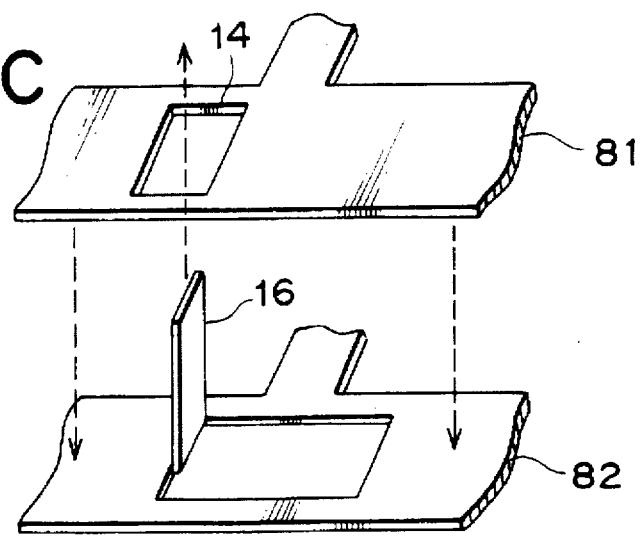
Figure 10D:
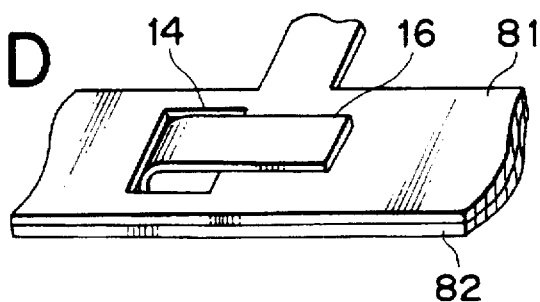

FIGS. 10A–10D show a fifth embodiment of a method for connecting a frame 81 for leads to a frame 82 for a die pad. In this embodiment, the connection is made by caulking, i.e., bending a tab or projection. A projection 16 on the frame 82 fits into a hole 14 in the frame 81. First, a projection is formed on the frame 82, as shown in FIG. 10A, by etching or punching. Then, the projection 16 is bent upward, as shown in FIG. 10B. A hole 14 corresponding to the projection 16 is formed in the frame 81 by etching or punching. One of the two frames 81 and 82 is put on the other with the projection 16 inserted into the hole 14. Then, the projection 16 is bent back, as shown in FIG. 10D. Thus, the frames 81 and 82 are fitted and fastened together. The shapes of the projection 16 and the hole 14 and the method for forming them are not limited to those described above.

Figure 11:
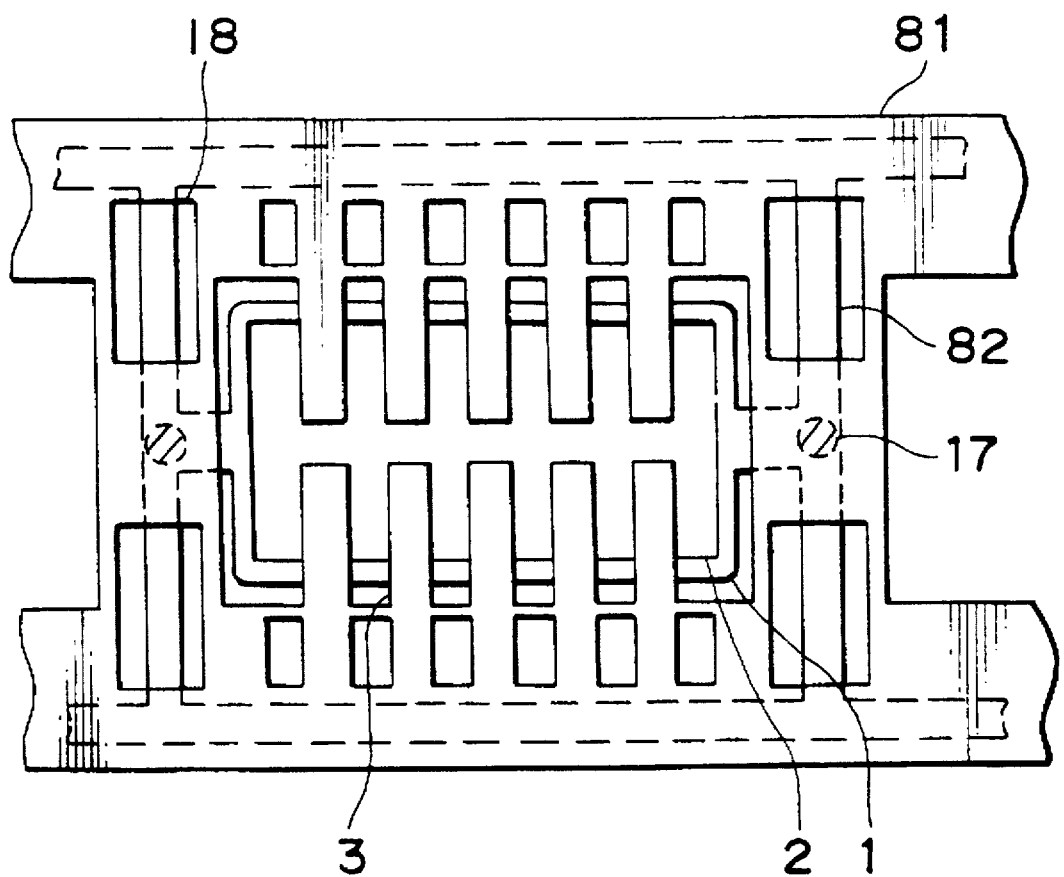
FIG. 11 is a plan view of two frames for use in the second aspect of the present invention, the two frames being connected to each other.
Figure 12A:
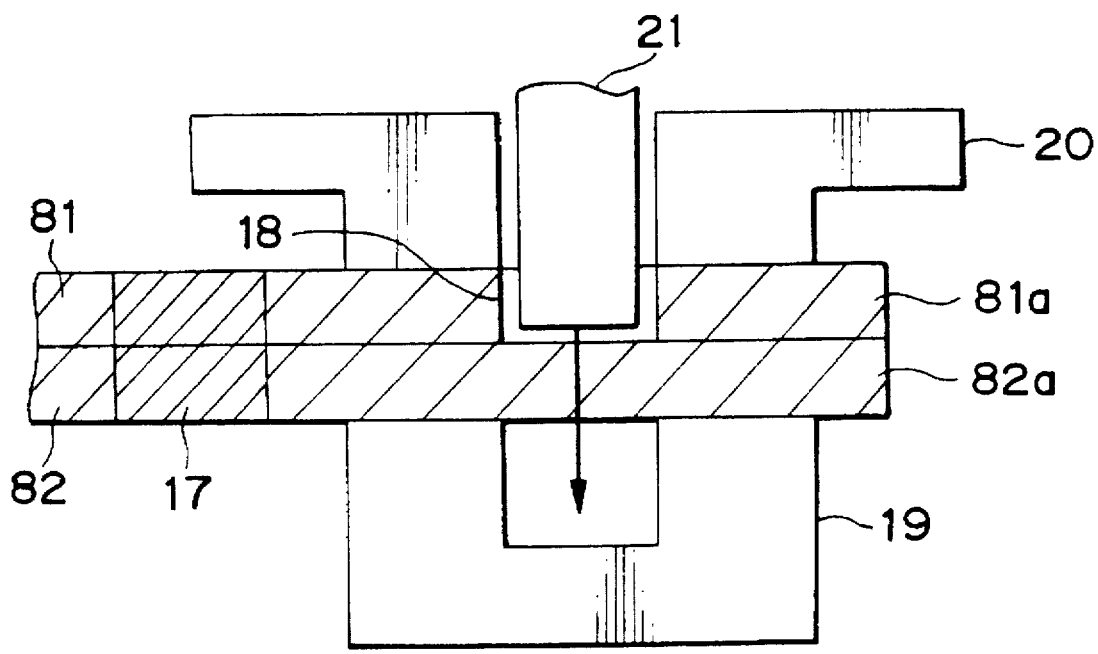
FIGS. 12A and 12B are side views for explanation of one example of methods for cutting a frame with regard to a production method in accordance with the second aspect of the present invention.
Figure 12B:
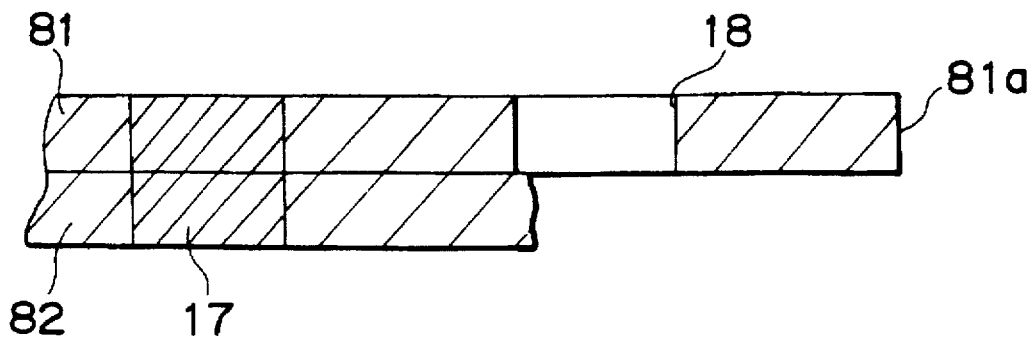

FIGS. 11, 12A, and 12B show one embodiment of a method for cutting off an unnecessary portion of an outer frame part 82a of a frame 82 for a die pad which has been fastened to a frame 81 for leads by means of any method described above. FIG. 11 shows a frame 82 for a die pad with a semiconductor chip mounted on a die pad, the frame 82 for a die pad being connected to the bottom of a frame 81 for leads. In this figure, there are shown connecting portions 17 (for example, spot welding portions) at which the frames are connected to each other and frame-cutting slits 18 in the frame 81 for leads.

The frame-cutting slits 18 in the frame 81 for leads provide a means for cutting off the frame 82 for a die pad except for a die pad 2 (including suspending leads) connected to the frame 81 at connecting portions 17 on both sides. As a result of the cutting, the frame 81 having the die pad 1 with the semiconductor chip 2 can be treated almost like a single sheet frame. Thus, during the succeeding processes, problems such as mis-transfer of frames and accumulation and leakage of solution, which often occur in two combined frames, can be effectively avoided.

This cutting method is shown in FIGS. 12A and 12B where a lower metal fixture is denoted by 19, a frame holder by 20, and a metal cutting element by 21. As shown in FIG. 12A, the frame 81 for leads and a die pad frame 82 which are connected to each other at the connecting portion 17 are put on the lower metal fixture 19 and held by the frame holder 20. The metal cutting element 21 is inserted into the frame-cutting slits 18 down to a position at which the metal cutting element 21 stops with a predetermined adequate gap from the lower metal fixture 19. Thus, the outer frame part of the frame 82 for a die pad is cut off from the frame 81 for leads.

As described previously, one known method for producing a semiconductor device having an LOC-structure is to use a single sheet leadframe having leads and a die pad formed in an integral fashion. Such a frame can be produced from a sheet of metal by means of cutting, such as punching or etching. Although this method has an advantage that fewer processing steps are required for producing a semiconductor device compared to the case where two frames are combined, it has disadvantages. Because of its structure, it is difficult to expand the width of a die pad to exceed the lead area, and a semiconductor chip cannot be die-bonded on a die pad in a stable fashion. Now, to solve such problems, in accordance with the fourth aspect of the present invention, a leadframe for use in a semiconductor device having an LOC-structure as well as a method in accordance with the fifth aspect of the present invention for producing a semiconductor device having an LOC-structure using such a leadframe will be described.

The Fourth and Fifth Aspects of the Invention

Figure 13:
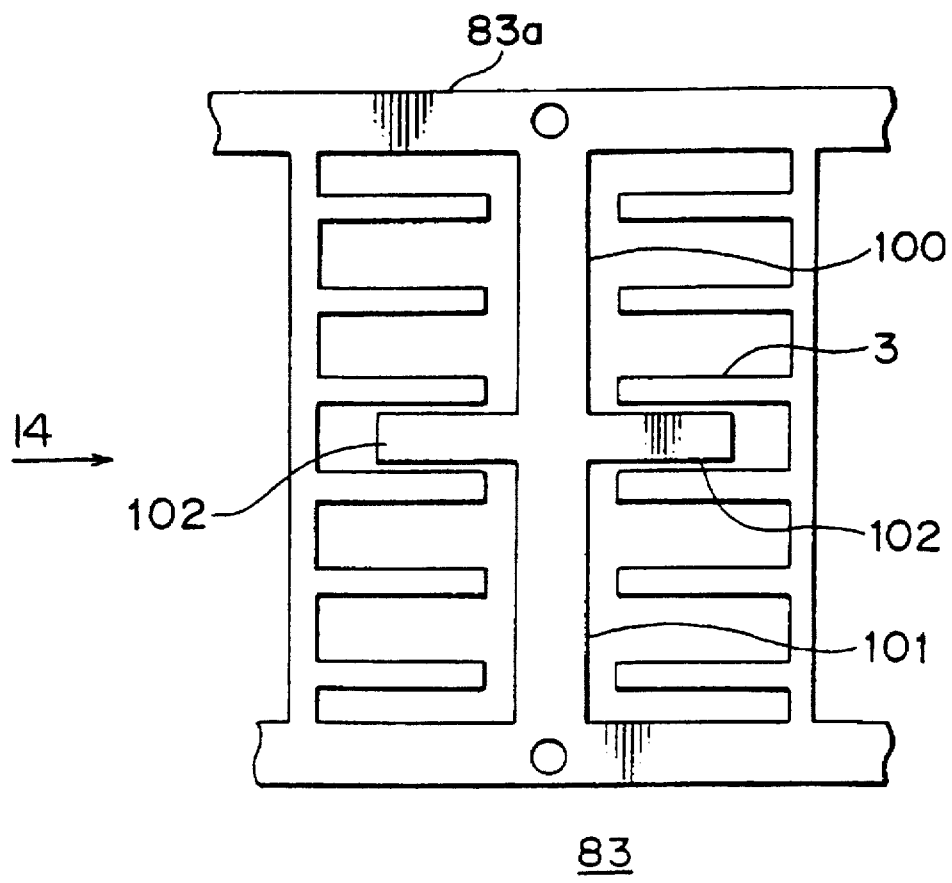
FIG. 13 is a plan view showing one embodiment of a leadframe relating to fourth and fifth aspects of the present invention.
Figure 14:
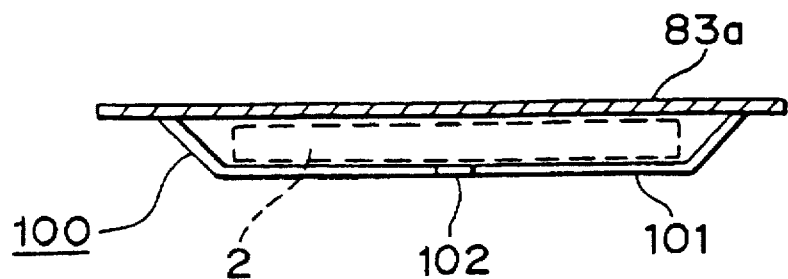
FIG. 14 is a side view of the leadframe of FIG. 13, seen in the direction of the arrow 14 of FIG. 13.

FIGS. 13 and 14 show an example of a leadframe in accordance with the fourth and fifth aspects of the present invention wherein FIG. 13 is a top view and FIG. 14 is a side view seen in the direction denoted by an arrow 14 in FIG. 13. As shown in FIG. 13, this leadframe 83 comprises a plurality of leads 3 inside of an outer frame 83a and also comprises a die pad 100 extending in a direction approximately perpendicular to the leads 3, the leads 3 and the die pad 100 being unitary. The die pad 100 comprises a conventional main pad 101 extending along the area corresponding to a central area of a semiconductor chip 2 in a range of its full length, and further comprises branch pads 102 extending from both sides of the main pad 101 in a cross shape. Thus, the width of the die pad is substantially widened. Each branch pad 102 is in the same plane as the main pad 101 and extends approximately perpendicular to the main pad 101. Furthermore, each branch pad 102 extends between neighboring leads among a plurality of leads 3 extending inward from both sides of the outer frame 83a at a predetermined interval. With this structure, the die pad 100 can be widened, exceeding the lead area, without modifying the location, shape, and/or length of leads 3. As shown in FIG. 14, the die pad 100 is sunk from the outer frame 83a, and a semiconductor chip 2 is die-bonded to the die pad 100 with, for example, hard solder.

Figure 15:
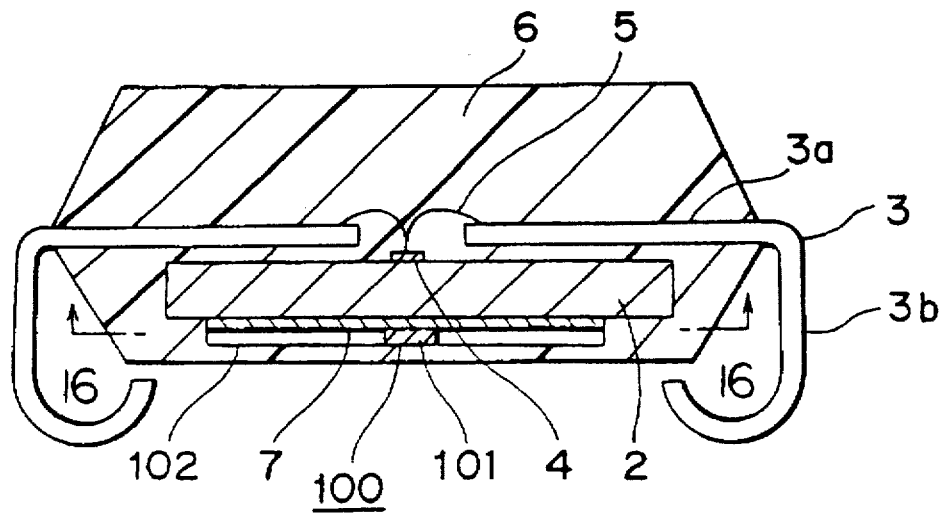
FIG. 15 is a cross-sectional view showing one embodiment of a semiconductor device produced by a production method in accordance with the fifth aspect of the present invention.
Figure 16:
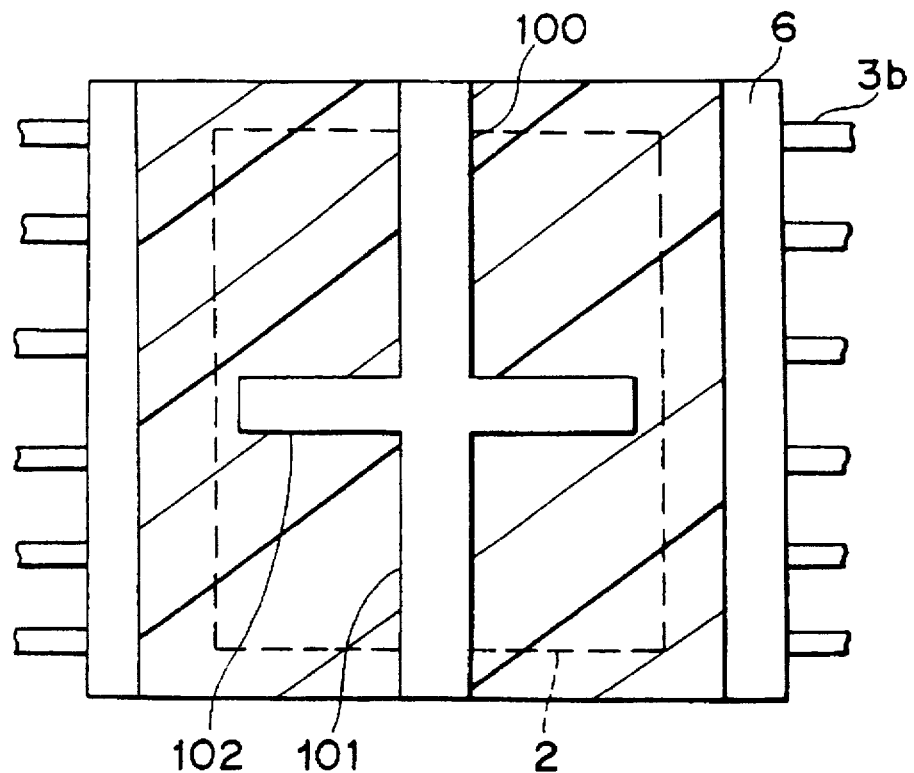
FIG. 16 is a cross-section of the semiconductor device of FIG. 15 taken along the lines 16—16 of FIG. 15.

FIGS. 15 and 16 show a semiconductor device produced by a production method in accordance with the fifth aspect of the present invention using the leadframe shown in FIG. 13. FIG. 15 is a cross-sectional view taken along a lead 3 of the semiconductor device. FIG. 16 is a cross-sectional view taken in the line 16—16 of FIG. 15. The basic structure is the same as that of a semiconductor device in accordance with the first aspect of the present invention shown FIG. 1. Thus, the same or similar portions are denoted by the same numerals. In the semiconductor device shown in FIGS. 15 and 16, there are provided only leads 3 extending over the semiconductor chip 2 and there are no common leads 3. The flowchart showing the production method will be the same as that in accordance with the second aspect of the present invention shown in FIG. 5 except that steps S2 and S3 are deleted.

Now, the method for producing a semiconductor device shown in FIGS. 15 and 16 will be described. As described above in connection with FIG. 14, a semiconductor chip 2 is inserted between the outer frame 83a of the leadframe 83 and the sunk die pad 100. Then, the semiconductor chip 2 is attached to the die pad 100 with, for example, hard solder 7 (die bonding step S1). As shown in FIG. 15, each of leads 3 floats without contacting the upper surface of the semiconductor chip 2.

Then, inner lead portions 3a of the leads 3 extending over the semiconductor chip 2 are each connected to electrodes 4 on the semiconductor chip 2 with wires 5 by means of ultrasonic-thermocompression wire-bonding (wire bonding step S4). In this step, when a wire 5 is compressed onto an electrode 4 on the semiconductor chip 2, mechanical force is applied to the semiconductor chip 2. However, due to the good stability of the semiconductor chip 2 die-bonded to the die pad 100, wire bonding can be easily and reliably completed with no problems. During the wire-bonding process, the die pad is heated to raise the temperature of the semiconductor chip 2 for easier wire bonding. Because the die pad 100 has a larger area than a conventional unitary leadframe having leads and a die pad, better thermal conduction from the die pad 100 to the semiconductor chip 2 is achieved. Thus, the temperature of the semiconductor chip 2 can be raised more effectively.

Then, the semiconductor chip 2, the die pad 100, the inner lead portions 3a, and thin metal wires 5 are encapsulated with, for example, epoxy resin into one body by means of, for example, transfer molding. Thus, molding resin 6 is completed (molding step S5). Each outer lead portion 3b extending outward from the molding resin 6 is plated (exterior plating step S6). Finally, an assembled semiconductor device is separated from the outer frame 83a of the leadframe 83, and then each outer lead portion 3b extending outward from the molding resin 6 of the semiconductor device is formed into a desired shape (lead forming step S7). Thus, a completed semiconductor device is obtained. A leadframe 83 used in actual production comprises a plurality of unit elements, such as shown in FIG. 13, the unit elements being successively connected to each other, and a plurality of semiconductor devices are produced at one time in a way similar to the second aspect of the present invention. If unnecessary, exterior plating is not performed, not only in this specific production method, but in any of the production methods described later.

In the completed semiconductor device of FIGS. 15 and 16, unlike semiconductor devices produced by using a conventional one-sheet frame, the back surface of the semiconductor chip 2 has a smaller area in direct contact with the molding resin 6. Thus, better adhesion is achieved between the back surface of the semiconductor chip 2 and the molding resin 6, and separation is avoided.

In the embodiment just described, the die pad 100 has the shape of a cross. However, the branch pad 102 may be formed only on one side of the main pad 101 of the die pad 100. Further, in a leadframe 83 shown in FIG. 17, each side of a main pad 101 of a die pad 100 has a plurality of branch pads 102 extending from each side. Each branch pad 102 of this leadframe 83 extends between neighboring leads 3. By using such a leadframe 83 having a die pad 100 with a larger number of branch pads 102, the stability of the semiconductor chip and thermal conduction efficiency during the wire-bonding process step are improved. Furthermore, a completed semiconductor device exhibits better adhesion between the back surface of a semiconductor chip and molding resin.

As described above in connection with FIGS. 13 and 17, in a leadframe in accordance with the fourth aspect of the present invention, a die pad 100 extends in the direction perpendicular to the longitudinal direction of a leadframe 83 (an actual leadframe comprises a plurality of unit elements shown in these figures, the unit elements being successively connected in the horizontal direction of these figures). Therefore, to insert a semiconductor chip 2 between a die pad 100 and an outer frame 83a, the chip 2 is inserted in the longitudinal direction of the leadframe 83 (the direction denoted by the arrow 14 in FIG. 13). In production lines, in general, leadframes are transferred in the longitudinal direction of the leadframes. This means that there is difficulty in the chip-insertion process due to the fact that semiconductor chips are inserted in the same direction as the leadframe-transfer path in the case of the leadframe 83 shown in FIGS. 13 and 17.

Figure 18:
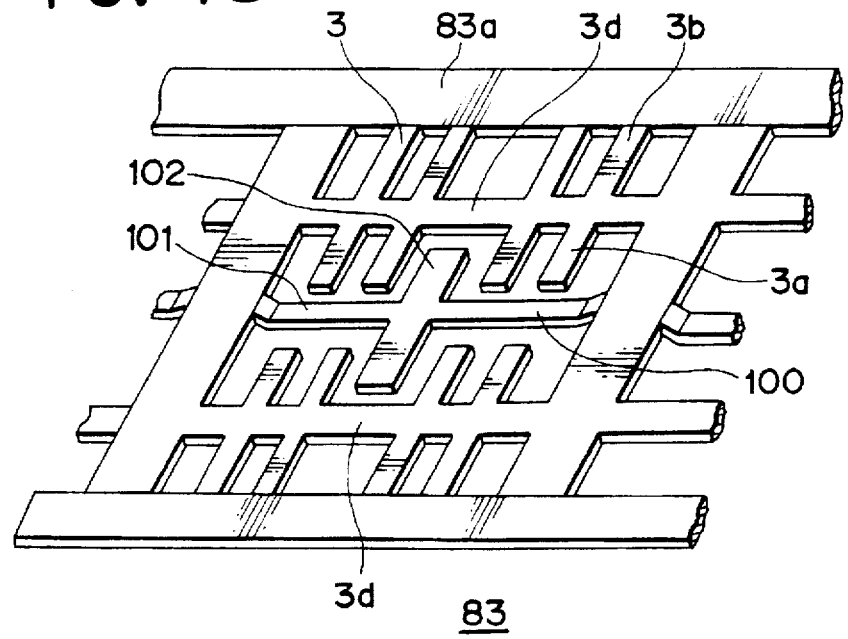
FIG. 18 is a perspective view showing another embodiment of a leadframe in accordance with the fourth aspect of the present invention.

Another embodiment is provided in accordance with the fourth aspect of the present invention as is shown in FIG. 18. In the leadframe 83 shown in FIG. 18, a main pad 101 of a die pad 100 extends in longitudinal direction of the leadframe 83, that is, in the same direction as that in which the leadframe 83 is transferred, and each lead 3 extends perpendicular to this direction. Both end portions of the die pad 100 are bent such that the die pad 100 is sunk from the outer frame 83a. Thus, a semiconductor chip can be inserted from a side position of the leadframe-transfer path, that is, in the direction perpendicular to the leadframe-transfer path, as shown by the arrow B. In this way, an easier chip-insertion process is achieved. In FIG. 18, there are shown tie-bars 3d for connecting leads 3 to each other, which are not shown in previous figures for other embodiments. These tie-bars 3d are cut off and separated into individual outer leads 3b in lead cutting and forming processes in which the semiconductor device is also separated from the outer frame part 83a.

The Sixth and Seventh Aspects of the Invention

Figure 17:
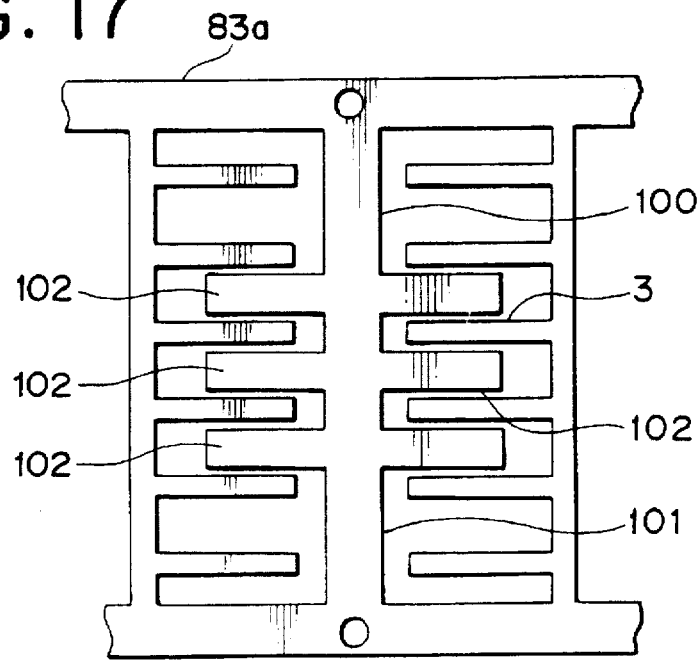
FIG. 17 is a plan view showing another embodiment of a leadframe relating to the fourth and fifth aspects of the present invention.
Figure 19:
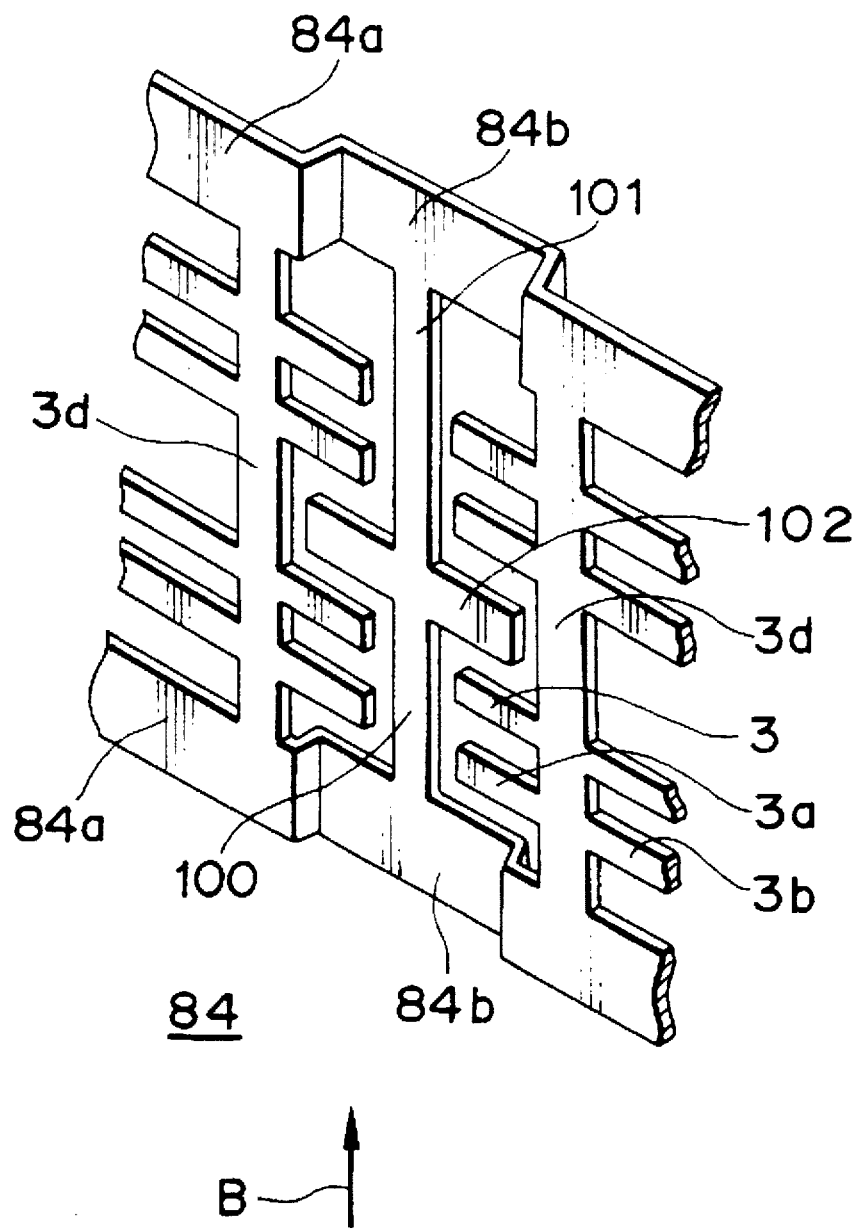
FIG. 19 is a plan view showing an embodiment of a leadframe relating to sixth and seventh aspects of the present invention.

In accordance with the sixth and seventh aspects of the present invention, FIG. 19 shows a leadframe which is modified from the leadframe shown in FIGS. 13 and 17 so that a semiconductor chip can be inserted from a side of a leadframe-transfer path. The sixth aspect of the invention relates to a leadframe and the seventh aspect relates to a method for producing a semiconductor device using a leadframe of the sixth aspect of the invention. In previously described embodiments, a die pad 100 is sunk from an outer frame 83a by bending both end portions (suspending leads) of the die pad 100, as shown in FIG. 14. In contrast, in a leadframe 84 shown in FIG. 19, both side portions of an outer frame part 84a to which a die pad 100 is connected are bent into a U-shape (U-shaped portions 84b) so that the die pad 100 is sunk from the outer frame 83a. Such a leadframe having a die pad 100 sunk by bending portions of the outer frame 84a into a U-shape has the following advantages: (1) the die pad 100 can be sunk more deeply; (2) this technology can be adapted to a thin leadframe having small mechanical strength; and (3) leads 3 extending from both sides can be located close to the leads on the opposite side. These advantages can be obtained independently of the relation in directions between the die pad and the frame-transfer paths. Thus, a leadframe in accordance with the sixth aspect of the present invention has no limitations on a direction in which a die pad extends, and it can be used in various fashions.

Figure 20:
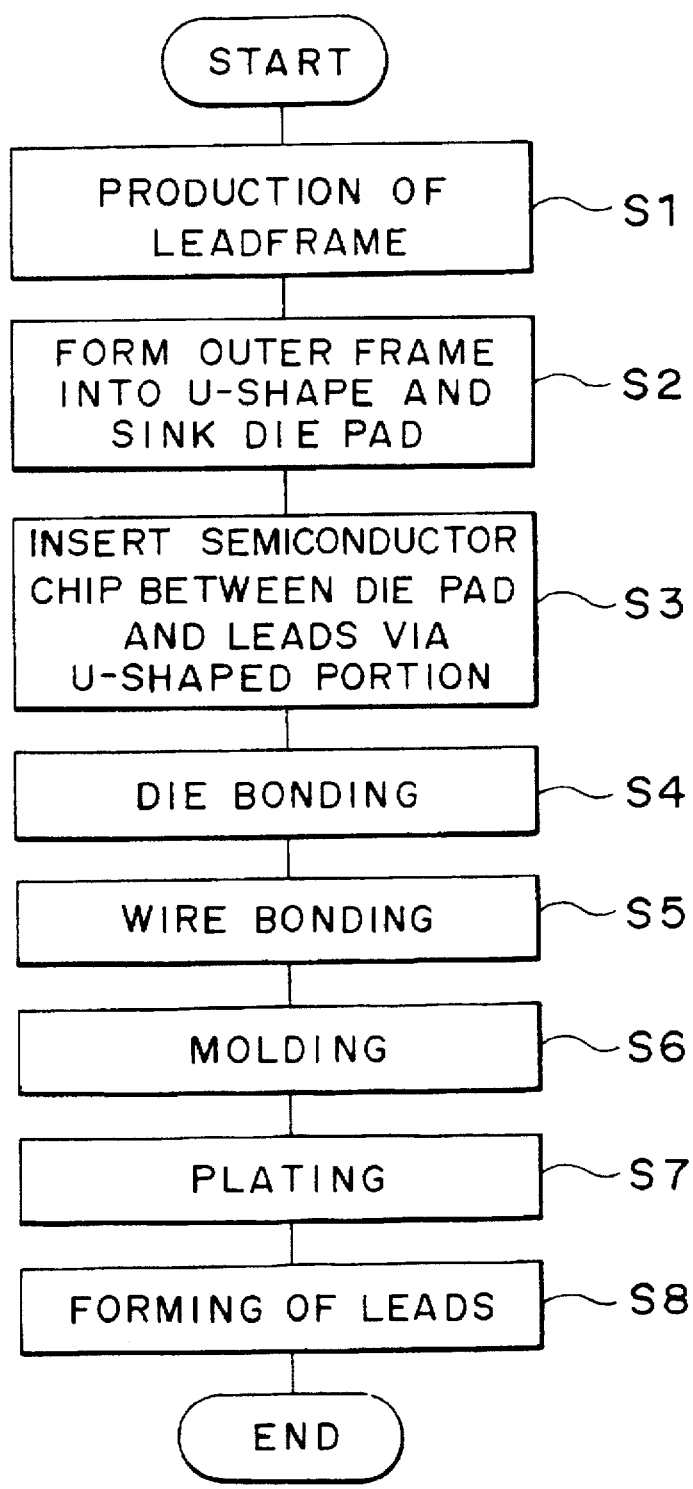
FIG. 20 is a flowchart showing a method for producing a semiconductor device in accordance with the seventh aspect of the present invention.
Figure 21:
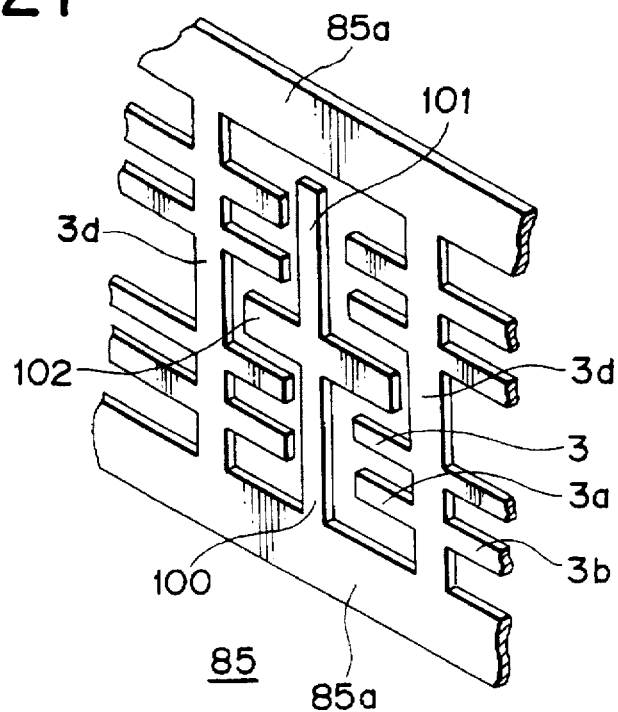
FIG. 21 is a perspective view showing an embodiment of a leadframe relating to eighth and ninth aspects of the present invention.

FIG. 20 is a flowchart showing a production method in accordance with the seventh aspect of the present invention. First, by punching or etching a sheet of flat metal (not shown), a leadframe 84 is produced in a planar form, the situation prior to that shown in FIG. 19 (leadframe production step S1). A die pad 100 is formed so that its main pad 101 extends perpendicular to the direction in which the leadframe 84 is to be transferred during production of a semiconductor device (that is, perpendicular to the longitudinal direction of a leadframe, in this case). Then, portions of both sides of the outer frame 84a to which the die pad is connected (that is, the portions of outer frame located at both sides of the leadframe-transfer path) are bent by means of, for example, pressing to form U-shaped portions 84b. These U-shaped portions project in the same direction, approximately perpendicular to the frame plane. In this way, the die pad 100 is sunk from the outer frame 84a and inner lead portions 3a (die pad depression step S2). A semiconductor chip (not shown) is inserted in the direction denoted by an arrow B between the die pad 100 and the inner lead portions 3a via one of these U-shaped portions 84b (semiconductor chip insertion step S3). Therefore, the U-shaped portions 84b should have a large enough size for a semiconductor chip to be inserted via one of them. After this step, a semiconductor device is completed through steps similar to those of previously described embodiments, such as die bonding step S4, wire bonding step S5, molding step S6, exterior-plating step S7, and lead forming step S8.

In accordance with this aspect of the present invention, leadframes 84 are transferred in the longitudinal direction of the leadframes 84 during production processes and semiconductor chips are inserted transverse to the transfer path. Thus, the chip-insertion process can be performed easily. Furthermore, because both sides of the outer frame 84a are bent into a U-shape, it is possible to shorten the distance from the inner lead portions 3a extending from one side of the outer frame and those extending from the other side. As a result, the inner lead portions 3a can extend to more central locations of the semiconductor chip.

The Eighth and Ninth Aspects of the Invention

The present invention includes another method for producing a semiconductor device using a unitary sheet frame comprising a die pad and leads.

Figure 32:
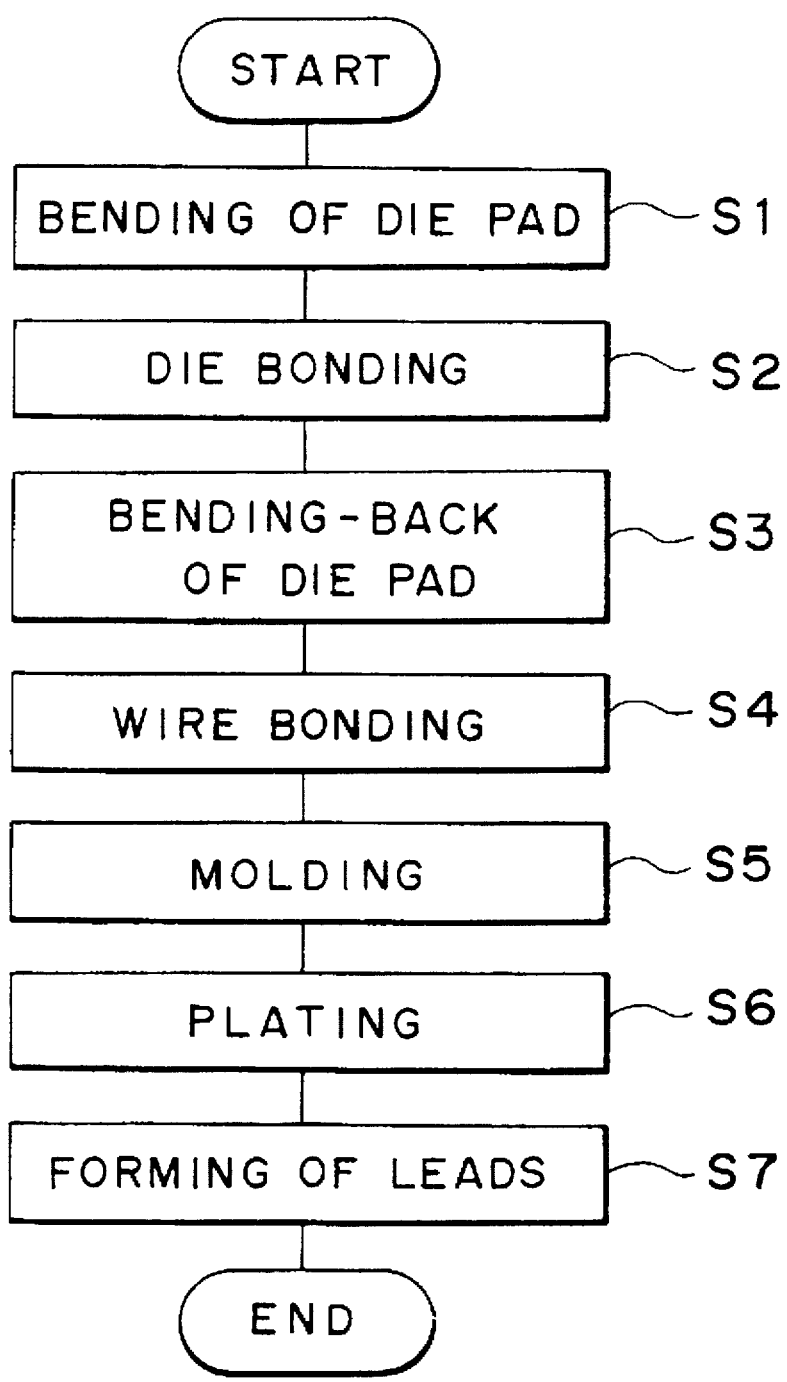
FIG. 32 is a flowchart showing an example of a method for producing a semiconductor device in accordance with the ninth aspect of the present invention.

In accordance with eighth and ninth aspects of the present invention, an embodiment is shown in FIGS. 21–24 relating to a leadframe and a method for producing a semiconductor device using this leadframe. In these figures, there are shown a leadframe 85 having an outer frame part 85a, a die pad 100, and a plurality of leads 3. The die pad 100 comprises a main pad 101 and branch pads 102. Each lead 3 comprises an inner lead portion 3a and an outer lead portion 3b. Tie-bars 3d connect leads to each other. This leadframe is the same as that shown in FIG. 13 except that only one end of the die pad 100 is connected to the outer frame part 85a. FIG. 32 is a flowchart showing a production method in accordance with the ninth aspect of the invention.

Figure 22:
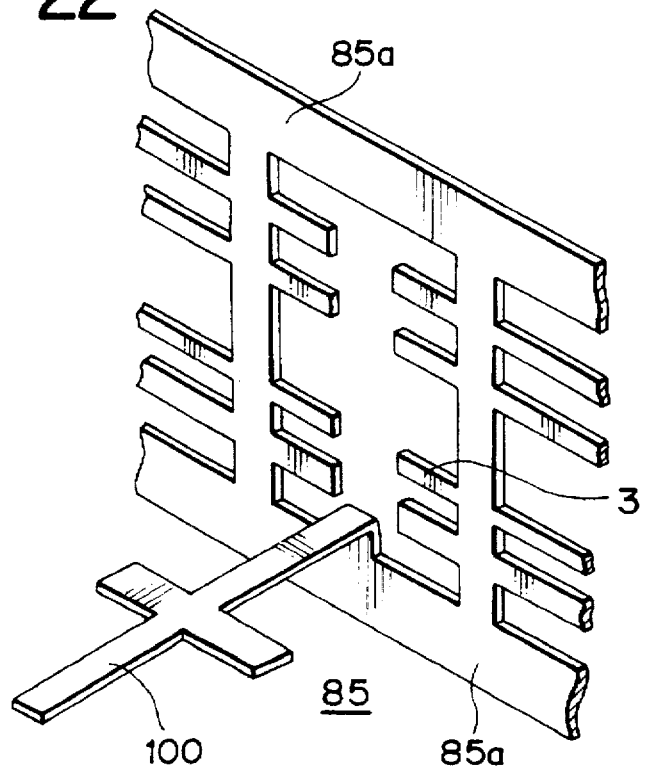
FIG. 22 is a perspective view showing a die pad bending step in a method for producing a semiconductor device in accordance with the ninth aspect of the present invention.
Figure 23:
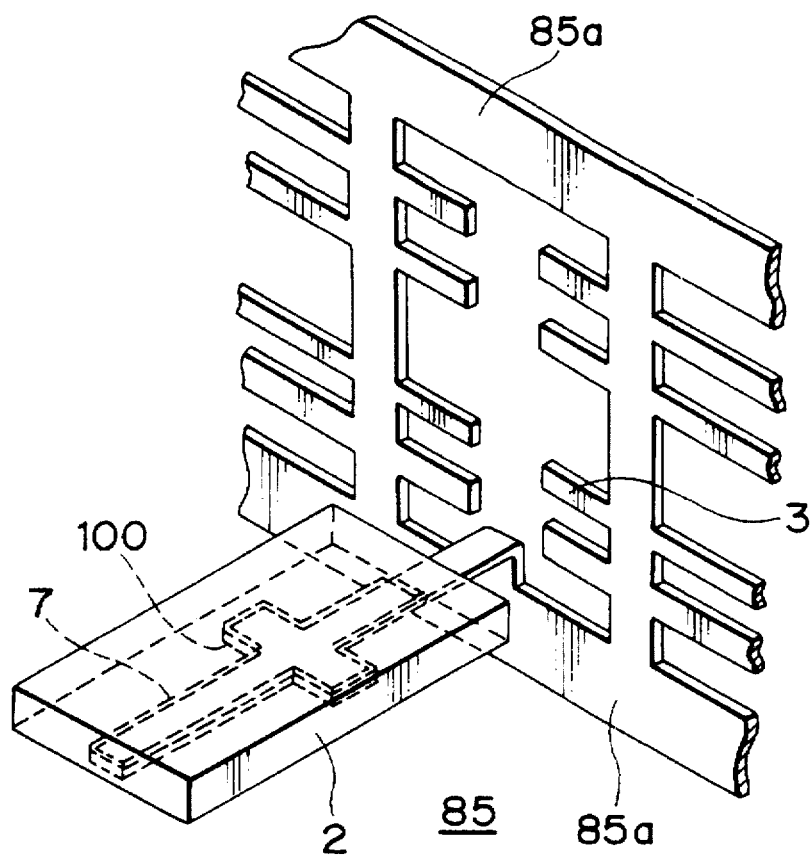
FIG. 23 is a perspective view showing a die-bonding step in a method for producing a semiconductor device in accordance with the ninth aspect of the present invention.

Referring to the figures, a production method in accordance with the ninth aspect of the invention will be described below. First, for example, a flat sheet of metal (not shown) is cut by punching or etching to produce a leadframe 85 as in FIG. 21. Here, one end of a die pad 100 is connected to an outer frame part 85a, and a plurality of leads 3 extend from both sides of the outer frame part 85a toward the die pad 100. Then, the die pad 100 is bent outward from the outer frame part 85a, as shown in FIG. 22 (die pad bending step S1). In this step, the die pad 100 is bent such that the die pad 100 is approximately perpendicular (at 90 degrees) to the outer frame 85a. Then, as shown in FIG. 23, a semiconductor chip 2 is attached onto the bent die pad 100 with hard solder 7, such as common solder (die bonding step S2). In this way, a semiconductor chip can be easily die-bonded to a die pad 100.

Figure 24:
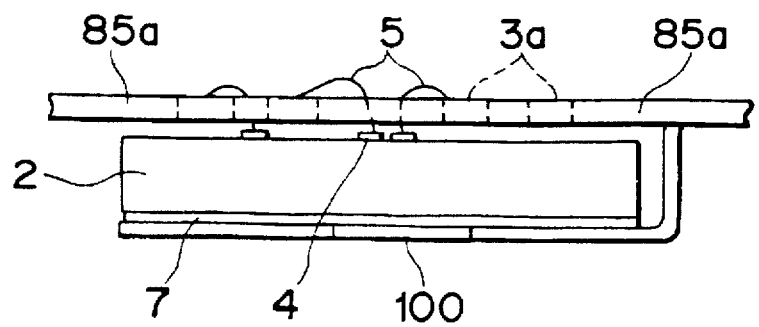
FIG. 24 is a side view showing a die pad bending step and a wire-bonding step in a method for producing a semiconductor device in accordance with the ninth aspect of the present invention.
Figure 25:
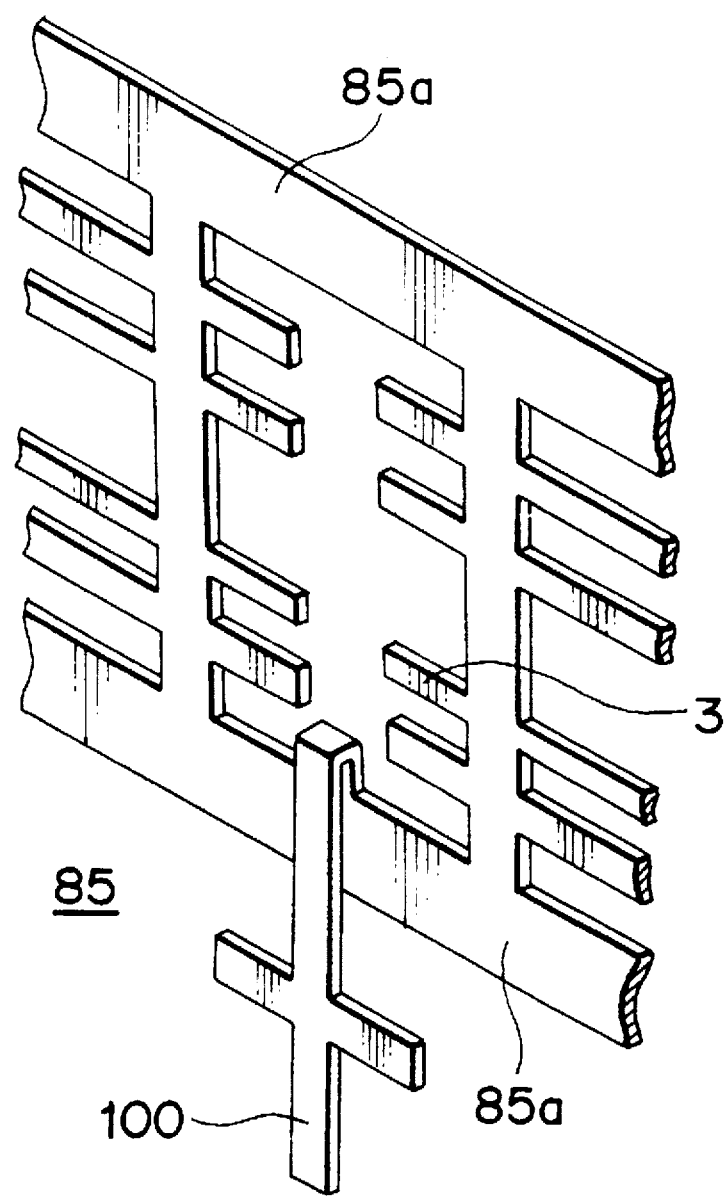
FIG. 25 is a perspective view showing another example of a die pad bending step in a method for producing a semiconductor device in accordance with the ninth aspect of the present invention.

Now, as shown in FIG. 24, the die pad 100, having the semiconductor chip 2 mounted on it, is bent back toward the outer frame part 85a (die pad bending-back step S3). As shown, the die pad 100 is bent in the form of an L-shape so that the inner lead portion 3a of each lead 3 extends over a primary surface of the semiconductor chip 2 having electrodes 4 and a circuit (not shown) on the primary surface of the semiconductor chip 2 in such a way that a predetermined constant spacing is maintained between the primary surface and the inner lead portions 3a. Then, the respective electrodes 4 on the semiconductor chip 4 are connected to corresponding inner lead portions 3a of leads 3 with wires 5 by ultrasonic-thermocompression wire bonding. Thus, electrical connections are made (wire bonding step S4). After this step, a semiconductor device is completed through the steps similar to those in the case of previous embodiments, such as molding step S5, exterior-plating step S6, and lead forming step S7. In this embodiment, a semiconductor chip 2 is die-bonded to the die pad 100 after the die pad 100 is bent by 90 degrees with respect to the outer frame part 85a. However, the bending angle of the die pad 100 is not so limited. The die pad 100 may be bent by 180 degrees as shown in FIG. 25 or by any arbitrary angle which results in easy die bonding.

The Tenth and Eleventh Aspects of the Invention

Figure 26:
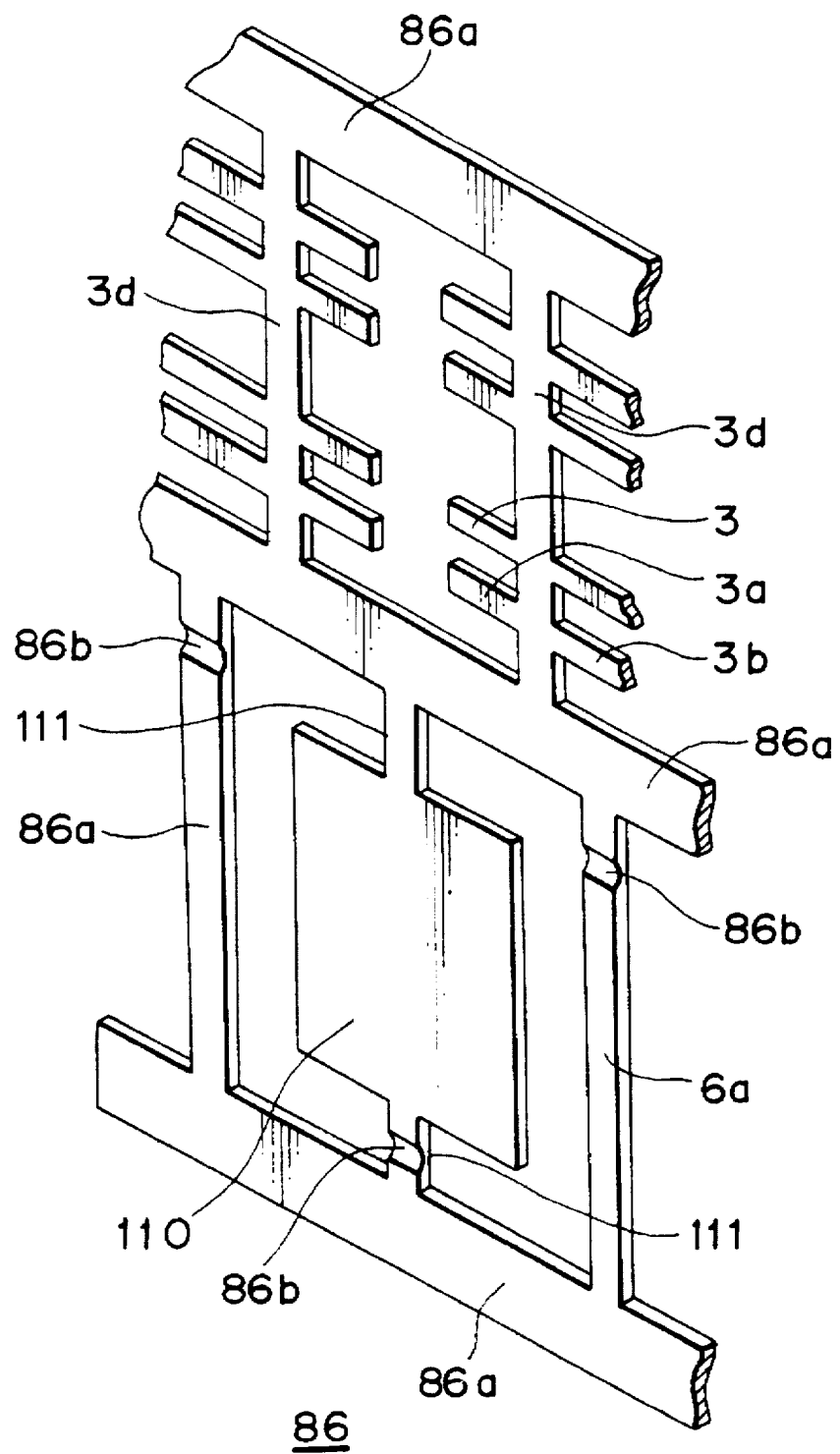
FIG. 26 is a perspective view showing an embodiment of a leadframe relating to tenth and eleventh aspects of the present invention.
Figure 27:
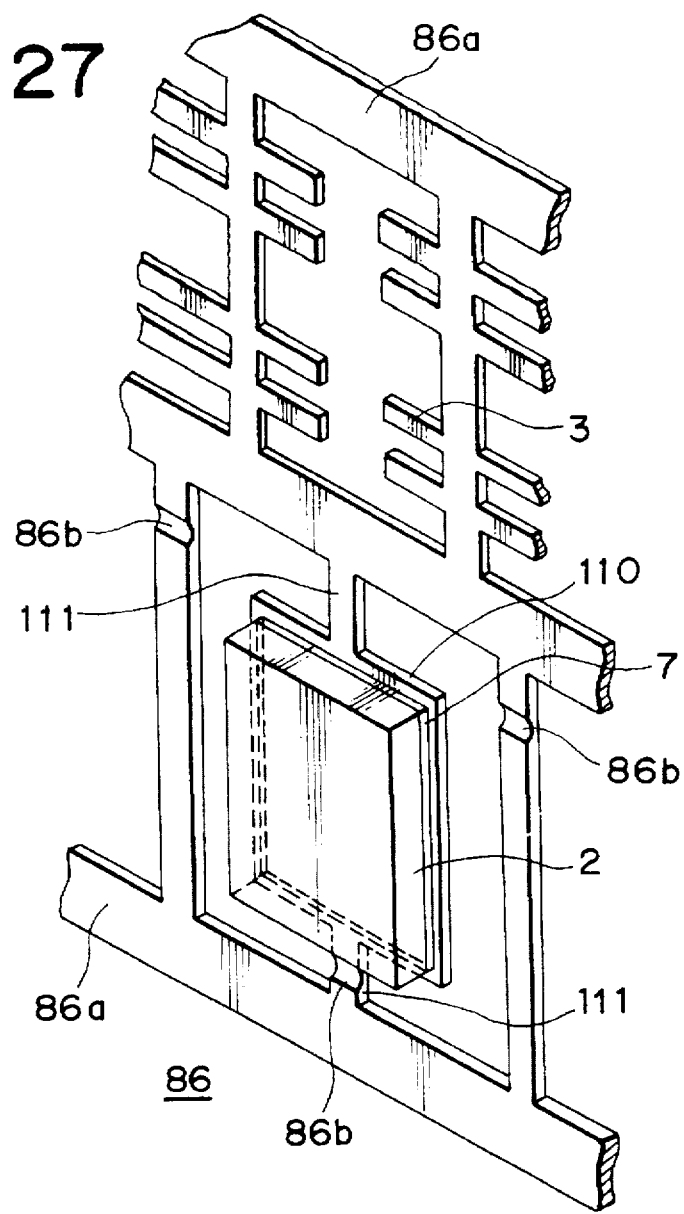
FIG. 27 is a perspective view showing a die-bonding step in a method for producing a semiconductor device in accordance with the eleventh aspect of the present invention.
Figure 28:
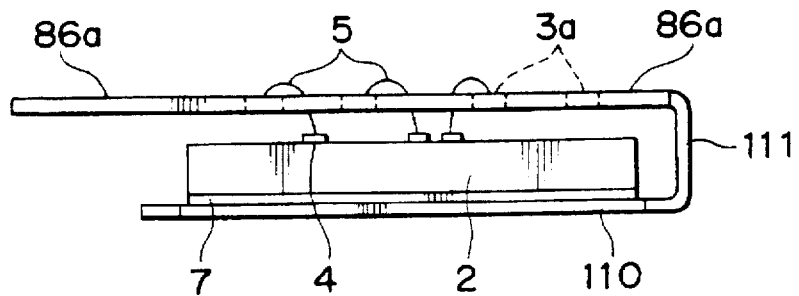
FIG. 28 is a side view showing a die pad folding step and a wire-bonding step in a method for producing a semiconductor device in accordance with the eleventh aspect of the present invention.

In accordance with tenth and eleventh aspects of the present invention, an embodiment is shown in FIGS. 26–28 relating to a leadframe and a method for producing a semiconductor device using this leadframe. In these figures, there is shown a wide leadframe 86 comprising an outer frame part 86a, a die pad 110 in sheet form, and leads 3. The outer frame part 86a includes three strips. The die pad 110 has a size similar to that of a semiconductor chip 2 to be mounted on it. The ends of the die pad 110 are connected respectively to first and second strips of the outer frame part 86a via suspending leads 111. The leads 3 are formed between the second and third strips.

Figure 33:
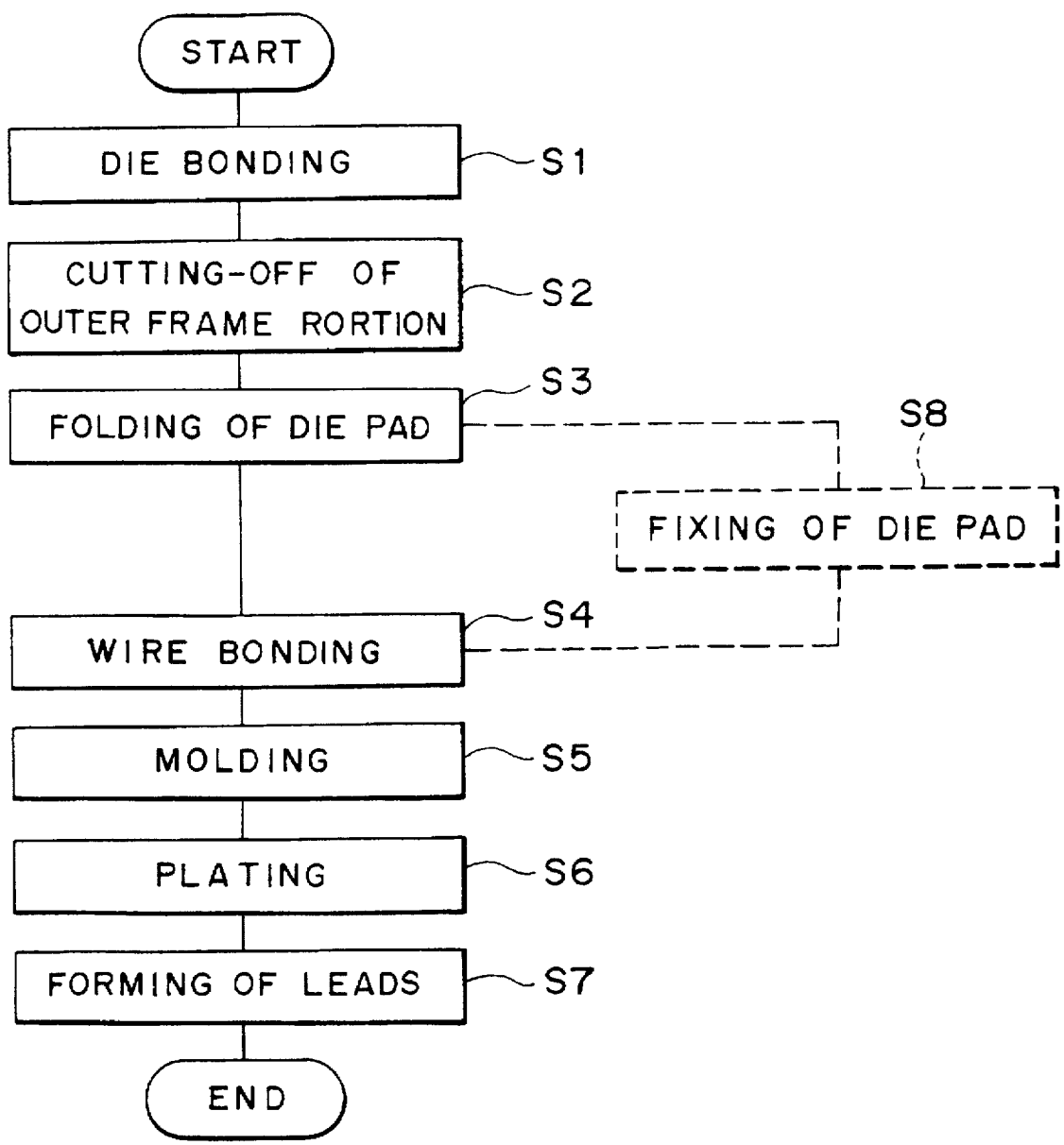
FIG. 33 is a flowchart showing examples of a method for producing a semiconductor device in accordance with the eleventh and thirteenth aspects of the present invention.

A production method in accordance with the eleventh aspect of the present invention is shown in a flowchart of FIG. 33.

Referring to the figures, a production method in accordance with the eleventh aspect of the present invention will be described below. First, as shown in FIG. 26, for example, one flat sheet of metal (not shown) is cut by punching or etching to produce a wide leadframe 86 having a unitary die pad and leads. In this leadframe 86, leads 3 are formed in a half-unit frame area and a die pad is formed in another neighboring half-unit frame area. Because the leadframe 86 is so formed, the die pad 110 makes it possible to directly bond a chip onto the die pad without any further modification. As shown in FIG. 27, a semiconductor chip 2 is attached to the die pad 110 with hard solder 7, such as common solder (die bonding step S1). Then, the outer frame part 86a is cut at three half-etched portions 86b to remove an unnecessary portion (the lower portion including the first strip in FIG. 27) of the outer frame part 86a around the die pad 110 (outer-frame cutting step S2). Furthermore, the die pad 110 with the mounted semiconductor chip 2 is bent at the suspending lead 111 into a U-shape so that the die pad 110 is folded toward the half-unit frame area of the outer frame part 86a in which the leads 3 are formed, as shown in a cross-sectional view of FIG. 28 (die pad folding step S3). In this way, the inner lead portion 3a of each lead 3 is arranged with a predetermined constant spacing from a primary surface (upper surface) of the semiconductor chip 2 where electrodes 4 and a circuit (not shown) are located. Then, a semiconductor device is completed through steps similar to those of previous embodiments, such as a wire bonding step S4, molding step S5, exterior-plating step S6, and lead forming step S7. Japanese Published Patent Application 63-34966 discloses production of a leadframe in the form of a sheet having an integrated die pad and leads and an area of the outer frame of the leadframe is folded to place leads opposite the die pad in a similar way to that of the present aspect of the invention. However, there is a significant difference that in the present aspect of the invention an unnecessary portion of an outer frame around a die pad is cut off, then a suspending lead 111 for connecting the die pad to the outer frame is bent into the U-shape to put the die pad opposite the leads. As can be seen, not only can these process steps be easily performed, but also, in succeeding steps, the leadframe can be easily handled. Moreover, because the unnecessary portion is removed, fewer transfer errors occur during the succeeding process steps.

The Twelfth and Thirteenth Aspects of the Invention

Figure 29:
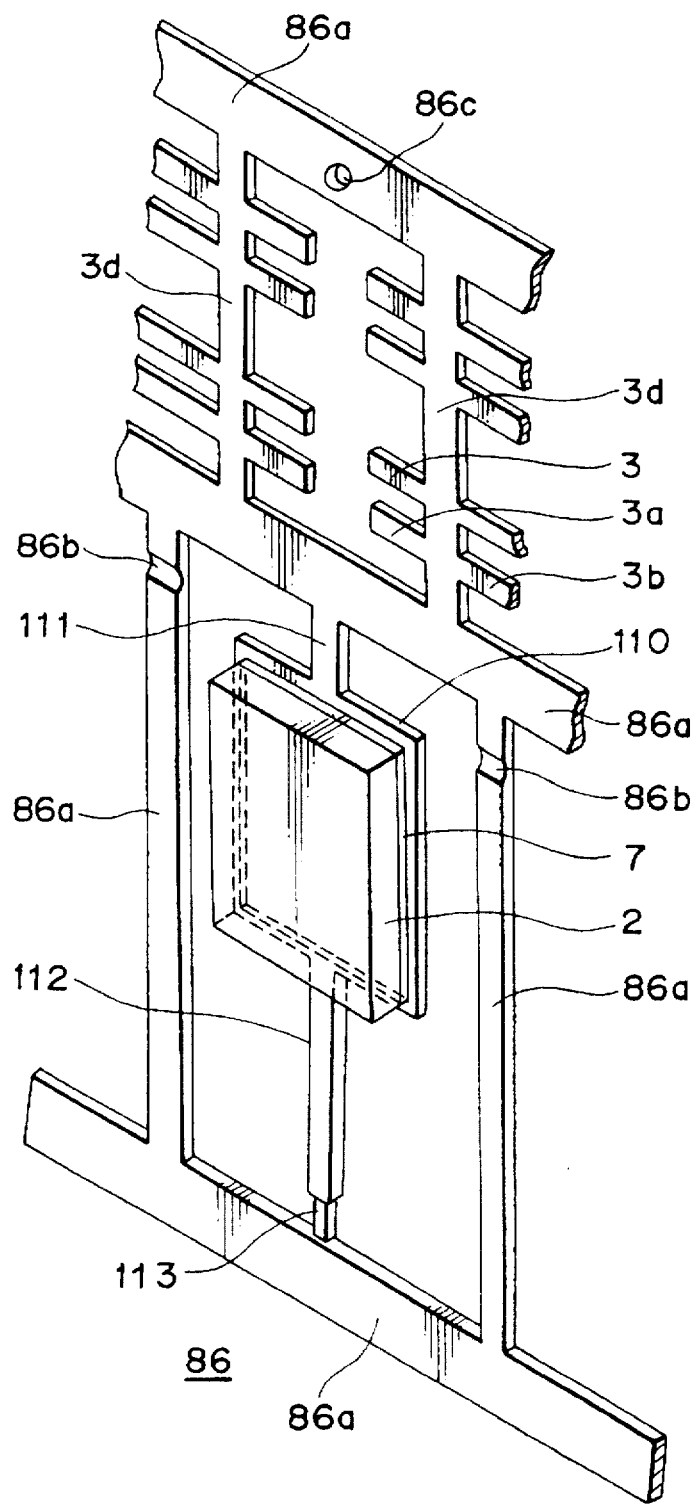
FIG. 29 is a perspective view showing a die-bonding step in a method for producing a semiconductor device relating to twelfth and thirteenth aspects of the present invention.
Figure 30:
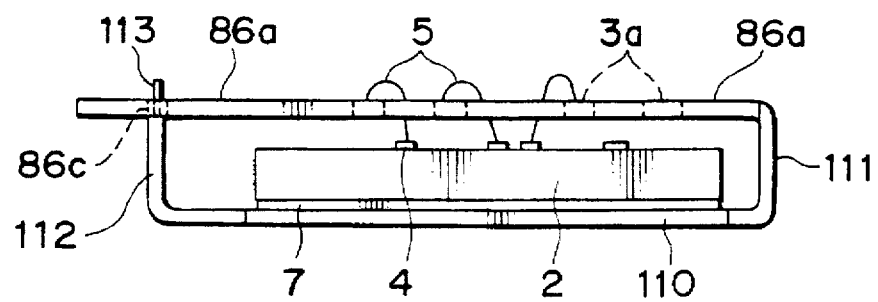
FIG. 30 is a side view showing a die pad folding step, die pad fixing step, and wire-bonding step in a method for producing a semiconductor device in accordance with the thirteenth aspect of the present invention.

FIGS. 29 and 30 show a leadframe and a method for producing a semiconductor device using this leadframe in accordance with twelfth and thirteenth aspects of the present invention. The difference from the leadframe described above in connection with FIG. 27 is that one of suspending leads on opposite sides of a die pad, that is, a suspending lead 112 extending in the direction opposite to leads 3 and being connected to a first strip is made longer. There is also provided a thinner half-etched portion 113 at the end of the suspending lead 112 and a fixing means, that is, a positioning hole 86c, in a strip located opposite the die pad 110 in an area of frame part 86a in which the leads 3 are formed. The process steps of this embodiment can be described by a flowchart with an added step denoted by dotted lines in FIG. 33.

In this embodiment, in a process step for cutting off an unnecessary portion of the outer frame part 86a around the die pad 110 as well as the half-etched portions 86b of the outer frame part 86a, the half-etched portion 113 is cut so that the longer suspending lead 112 remains connected to the die pad 110. Then, by bending a suspending lead 111 into a U-shape as shown in FIG. 30, the die pad 110 with a mounted semiconductor chip 2 is folded toward the frame area part 86a in which the leads 3 are formed (die pad folding step S3). After that, the longer suspending lead 112 is bent into an L-shape and the thinned half-etched portion 113 is inserted into (or connected to) the positioning hole 86c in the strip of the outer frame part 86a to fix the die pad 110 to the leads 3 (die pad fixing step S8). Thus, the present aspect of the invention provides a method adaptable to mass production that ensures that the distance between the surface of the semiconductor chip 2 and the inner lead portions 3a can be kept at a certain constant value, which results in better production yields. The other process steps are the same as those of the eleventh aspect of the present invention.

The Fourteenth Aspect of the Invention

Figure 31:
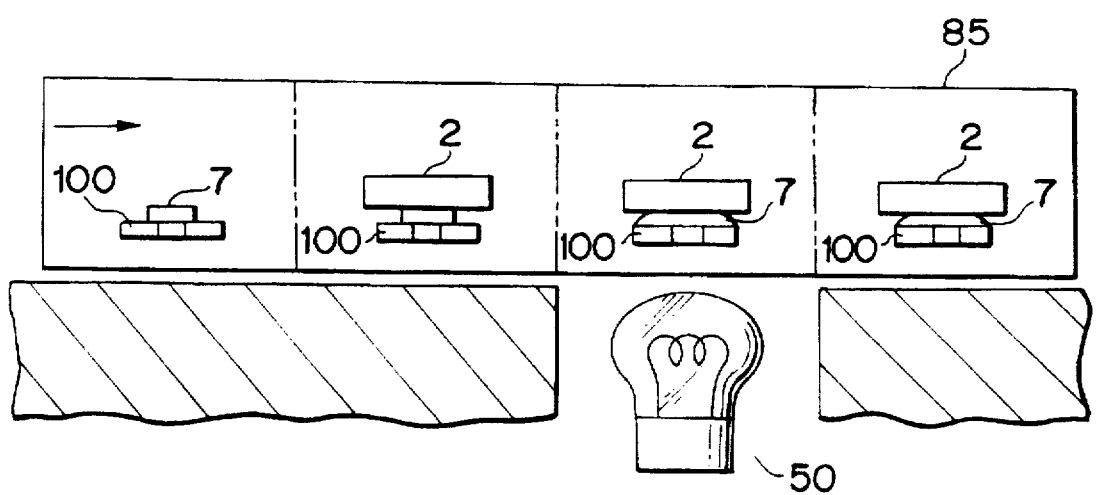
FIG. 31 is a schematic view showing an embodiment of a die-bonding step in a method for producing a semiconductor device in accordance with a fourteenth aspect of the present invention.
Figure 34:
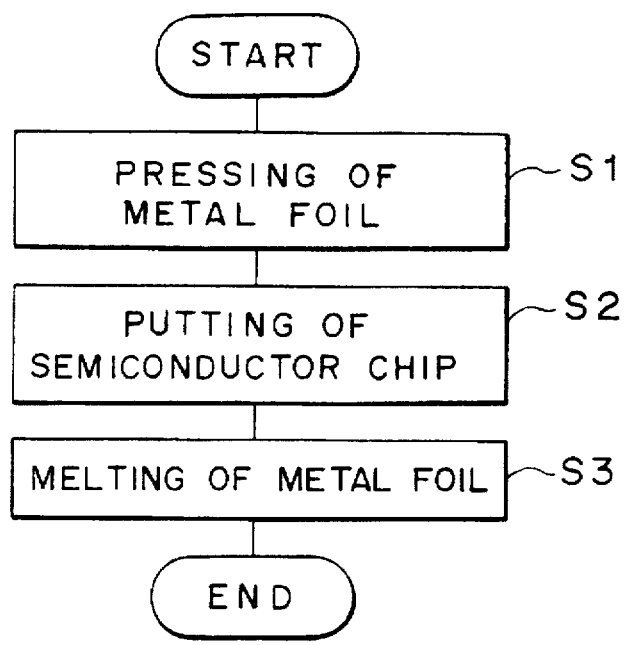
FIG. 34 is a flowchart showing one example of a die-bonding method in accordance with the fourteenth aspect of the present invention.
Figure 35:
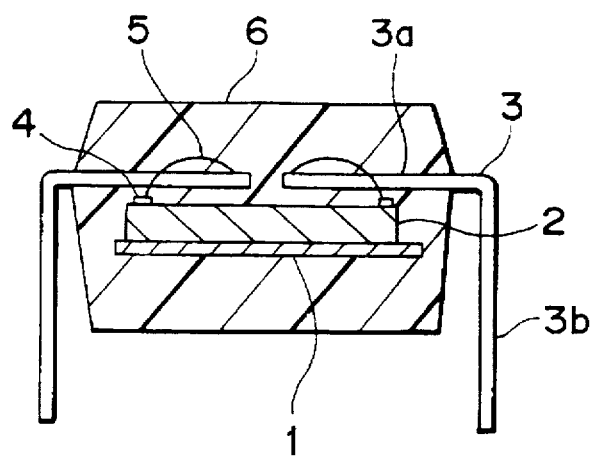
FIG. 35 is a cross-sectional view of a conventional semiconductor device of a similar type.

In accordance with the fourteenth aspect of the present invention, a die-bonding method can be used in the die-bonding steps previously described for producing semiconductor devices. FIG. 31 shows an example of die-bonding methods used in production of a semiconductor device in accordance with the fourteenth aspect of the present invention. FIG. 34 is a flowchart showing this die-bonding method. In actual production, as described earlier, in order to produce a plurality of semiconductor devices at one time, a leadframe, for example, the leadframe 85 shown in FIGS. 21 and 22, comprises a plurality of unit elements successively connected to neighboring unit elements, wherein each unit element comprises a die pad 100 and leads 3. The process steps described below are successively performed for one unit element at one time by shifting the leadframe 85 by one block (one pitch). In the first step, a metal foil comprising, for example, hard solder 7, such as conventional solder, is placed on and pressed onto a die pad 100 (metal foil placement and pressing step S1). Then, the leadframe 85 is shifted by one pitch and a semiconductor chip 2 is put on the metal foil 7 on the die pad 100 (semiconductor chip putting step S2). After another one-pitch shift, the die pad 100 is heated at its bottom portion by non-contacting heating means, such as radiation from a heating lamp 50, to melt the metal foil 7 (metal foil melting step S3). By stopping heating (or by intentionally cooling), the melted metal foil 7 is solidified and the semiconductor chip 2 is connected to the die pad 100.

In actual production lines, in accordance with the die-bonding method described above, die bonding can be easily performed by shifting a leadframe by one pitch at a time. Especially in the case where a semiconductor chip is inserted between leads of a leadframe and a sunk die pad, this method makes the die-bonding process significantly easier. In the specific embodiment described above, the metal foil 7 is melted by heating the bottom of a die pad so that a circuit on the upper surface of a semiconductor chip is not damaged. However, if the degree of heating is below a permissible level, the heating can be performed from the upper side or from both upper and lower sides.

In a semiconductor device in accordance with the first aspect of the present invention, hard solder having no moisture absorption is used as a die-bonding material for die-bonding a semiconductor chip. As a result, moisture is not absorbed into the die-bonding material, and it is possible to avoid problems such as corrosion of the semiconductor chip, cracks in a package, and separation between the semiconductor chip and the die pad. Thus, a higher-reliability semiconductor device is obtained.

In a method in accordance with the second aspect of the present invention for producing a semiconductor device, after two leadframes, that is, one for leads and the other for a die pad, are connected to each other, an unnecessary portion of an outer frame part of the leadframe for a die pad is cut off and removed from the other portions via frame-cutting slits in the frame for leads. Thus, during succeeding processes, the leadframes can be treated as if the leadframe comprises only one frame. As a result, production processes are simplified and can be performed easily. Therefore, production efficiency and production yield are improved. The third aspect of the present invention provides a leadframe having an advantage that after two leadframes, one for leads and the other for a die pad, are connected to each other, an unnecessary portion of one frame can be cut off and removed from the other portions.

In accordance with the fourth aspect of the present invention, a leadframe comprises a die pad including branch pads on both sides of the main die pad portion, wherein each branch pad extends perpendicular to the main die pad portion, and wherein each branch pad extends between leads. In this way, the width and the area of the die pad can be made substantially larger without modifying leads. The fifth aspect of the present invention provides a production method that makes it possible to hold and fix a semiconductor chip on a die pad in a more stable manner and, to improve thermal conduction efficiency between the die pad and the semiconductor chip. As a result, production processes, especially a wire-bonding process, can be performed easily, accurately, and efficiently. Thus, a highly reliable semiconductor device is produced. Compared to a semiconductor device produced by using a conventional leadframe having a narrow die pad, the semiconductor device in accordance with this aspect of the invention has a smaller area in direct contact with molding resin. As a result, there is less possibility of separation of the molding resin from the semiconductor chip. Thus, a higher-reliability semiconductor device is be obtained.

In a leadframe in accordance with the sixth aspect of the present invention, the portions on both sides of an outer frame to which a die pad is connected are bent into a U-shape to sink the die pad. Compared with sinking the die pad by bending the suspending leads on both sides of the die pad, this leadframe has advantages in that the die pad can be sunk more deeply, larger mechanical strength is obtained, and the distance between leads extending from one side and those extending from the other side is shortened. The seventh aspect of the present invention provides a production method whereby a die pad extending perpendicular to the direction in which the leadframe is transferred during production of a semiconductor device is sunk by bending both side portions of the outer frame to which the die pad is connected into a U-shape, so that a semiconductor chip can be inserted from a location transverse to the leadframe-transfer path. Thus, the chip-insertion process can be performed easily. Furthermore, when the side portions are bent into a U-shape, the die pad is sunk from the leads, and, at the same time, the leads extending from one side become closer to the leads extending from the other side. As a result, the leads reach positions closer to the central part of the semiconductor chip, and it is possible to increase flexibility in electrode location.

In accordance with the eighth and ninth aspects of the present invention relating to a leadframe and a method for producing a semiconductor device using this leadframe wherein the leadframe includes a unitary die pad and leads, the die pad can be bent outward from the outer frame and a semiconductor chip can be die-bonded to the die pad. This arrangement provides easier and more reliable processing compared to the case where a semiconductor chip is inserted between a die pad and leads.

In accordance with the tenth and eleventh aspects of the present invention relating to a leadframe and a method for producing a semiconductor device using this leadframe, a unitary leadframe includes a die pad and leads, the die pad is formed within an outer frame area adjacent to another outer frame area in which leads are formed, and both sides of the die pad are connected to the outer frame via suspending leads. A semiconductor chip is die-bonded to the die pad, and an unnecessary portion of the outer frame part around the die pad is cut off. After that, the suspending lead connected to the side of the die pad closer to the lead area is bent into a U-shape such that the die pad having the mounted semiconductor chip is folded over the leads. This process can be performed easily. Furthermore, because the unnecessary portion of the outer frame is removed, various advantages are obtained such that the succeeding process steps are made easier, transfer errors during the production processes can be decreased, and the production efficiency can be improved.

In accordance with the twelfth and thirteenth aspects of the present invention with regard to a leadframe and a method for producing a semiconductor device using this leadframe, firmer connection of the die pad to an outer frame area for leads is achieved by modifying the leadframe and the method in accordance with the tenth and eleventh aspects of the invention so that a suspending lead portion remaining connected to the die pad is bent and connected to the outer frame for leads. Thus, the succeeding processes can be performed more easily and accurately.

In accordance with the fourteenth aspect of the present invention with regard to a die-bonding method, metal foil is placed on and pressed onto a die pad, a semiconductor chip is put on this metal foil, and the metal foil is melted by heating. Then, the heating is stopped to solidify the metal foil and to attach the semiconductor chip to the die pad. This process step is carried out by shifting the leadframe by one pitch at a time. Thus, this method is suitable for use in a production line to die-bond a chip on a leadframe that is transferred on the production line. This method provides significant advantages in that die-bonding is easier and more effective and production efficiency is improved, in particular where die-bonding is performed after a semiconductor chip is inserted between the die pad and inner lead portions.

What is claimed is:

1. A method for producing a semiconductor device having an lead-on-chip structure wherein leads extend across a semiconductor chip, the semiconductor device using a leadframe including a die pad for supporting a semiconductor chip, a plurality of leads extending toward the die pad, each of the leads having an inner lead portion and an outer lead portion, and an outer frame connecting the die pad and the leads to each other wherein only one end of the die pad is connected to the outer frame so that the die pad may be bent with respect to the outer frame; the method comprising:

bending the die pad outward from the outer frame;

die-bonding a semiconductor chip to the bent die pad;

bending the die pad having the semiconductor chip attached toward the outer frame such that the inner lead portion of each of the leads extends generally parallel to the semiconductor chip with a predetermined spacing between the each inner lead portion and the semiconductor chip;

wire-bonding the inner lead portions of the leads to corresponding electrodes on the semiconductor chip;

molding to seal the semiconductor chip and die pad into one body with the outer lead portion of each of the leads exposed outside the body; and separating the semiconductor device from the outer frame of the leadframe and forming the outer lead portion of each of the leads.

2. The method of claim 1 wherein bending the die pad outward from the outer leadframe comprises bending the die pad to be substantially perpendicular to the outer frame and bending the die pad having the semiconductor chip attached toward the outer frame comprises bending the die pad to be substantially parallel to the outer frame.

3. The method of claim 1 wherein bending the die pad outward from the outer leadframe comprises bending the die pad to be transverse to the outer frame and bending the die pad having the semiconductor chip attached toward the outer frame comprises bending the die pad to be substantially parallel to the outer frame.

4. The method of claim 1 wherein bending the die pad outward from the outer leadframe comprises bending the die pad to be parallel to the outer frame and bending the die pad having the semiconductor chip attached toward the outer frame comprises bending the die pad to be substantially parallel to the outer frame.

* * * * *